United States Patent [19]

Jyouno et al.

[11] Patent Number: 5,870,218
[45] Date of Patent: Feb. 9, 1999

[54] NONVOLATILE SEMICONDUCTOR MEMORY DEVICE WHICH STORES MULTI-VALUE INFORMATION

[75] Inventors: Yusuke Jyouno, Higashimurayama; Takayuki Kawahara, Higashiyamato; Katsutaka Kimura, Akishima, all of Japan

[73] Assignee: Hitaachi, Ltd., Tokyo, Japan

[21] Appl. No.: 841,612

[22] Filed: Apr. 30, 1997

[30] Foreign Application Priority Data

May 1, 1996 [JP] Japan ..................................... 8-110748

[51] Int. Cl.⁶ ................................................. G11C 11/34
[52] U.S. Cl. ............................... 365/185.03; 365/185.18; 365/185.21; 365/185.22
[58] Field of Search ........................ 365/185.03, 185.18, 365/185.22, 185.21

[56] References Cited

U.S. PATENT DOCUMENTS

| | | | |
|---|---|---|---|
| 4,964,079 | 10/1990 | Devin ................................. | 365/185.03 |
| 5,365,486 | 11/1994 | Schreck ............................. | 365/185.22 |
| 5,555,204 | 9/1996 | Endoh et al. ..................... | 365/189.01 |
| 5,570,315 | 10/1996 | Tanaka et al. .................... | 365/185.22 |
| 5,602,789 | 2/1997 | Endoh et al. ........................... | 365/201 |
| 5,621,682 | 4/1997 | Tanzawa et al. .................. | 365/185.03 |

FOREIGN PATENT DOCUMENTS

| | | |
|---|---|---|
| 1-134793 | 5/1989 | Japan . |
| 4-57294 | 2/1992 | Japan . |
| 4-238196 | 8/1992 | Japan . |
| 07241116 | 4/1997 | Japan . |
| 9-91971 | 4/1997 | Japan . |

OTHER PUBLICATIONS

T. Tanaka et al., "High–Speed Programming and Program–Verify Methods Suitable for Low–Voltage Flash Memories", 1994 Symposium on VLSI Circuits Digest of Technical Papers, pp. 61–62.

Digest of Technical Papers, TP 2.1: A 3.3V 128Mb Multi–Level NAND Flash Memory for Mass Storage Applications, T. Jung, et al., ISSCC96/Session 2/Flash Memory/Paper TP 2.1, 1996 EEE International Solid State Circuits Conf.

Primary Examiner—David Nelms
Assistant Examiner—Hoai V. Ho
Attorney, Agent, or Firm—Antonelli, Terry, Stout & Kraus, LLP

[57] ABSTRACT

To enable one non-volatile memory cell to store four-value information, three different kinds of threshold voltages are serially applied to a word line in a verify operation to execute a write operation, the threshold voltages of the memory cell are controlled, and two-value (one-bit) information corresponding to the four-value (two-bit) information to be written are synthesized by a write data conversion circuit for each of the write operations carried out three times. In this way, the four-value (two-bit) information are written into one memory cell, and the memory capacity of the memory cell can be increased. In the information read operation, three different kinds of voltages are applied to a word line, three kinds of two-value (one-bit) information so read out are synthesized by a read conversion circuit and the memory information of the memory cell are converted to the two-bit information.

40 Claims, 25 Drawing Sheets

WRITE FOUR-VALUE DATA

[WRITE 1]: WRITE PULSE WIDTH: $w11<w12<..<w1n$
[WRITE 2]: WRITE PULSE WIDTH: $w21<w22<..<w2n$
[WRITE 3]: WRITE PULSE WIDTH: $w31<w32<..<w3n$

[WRITE 1] : WRITE PULSE VOLTAGE : Vw11<Vw12<..<Vw1n
[WRITE 2] : WRITE PULSE VOLTAGE : Vw21<Vw22<..<Vw2n
[WRITE 3] : WRITE PULSE VOLTAGE : Vw31<Vw32<..<Vw3n

FIG. 16A

| WOT | WET | W1T |
|---|---|---|
| 0 | 0 | 0 |
| 0 | 1 | 1 |
| 1 | 0 | 1 |
| 1 | 1 | 1 |

↓ IOT

| WOB | WEB | W1B |
|---|---|---|
| 1 | 1 | 1 |
| 1 | 0 | 0 |
| 0 | 1 | 0 |
| 0 | 0 | 0 |

↓ IOB

FIG. 16B

| WOT | WET | W2T |
|---|---|---|
| 0 | 0 | 0 |
| 0 | 1 | 0 |
| 1 | 0 | 1 |
| 1 | 1 | 1 |

↓ IOT

| WOB | WEB | W2B |
|---|---|---|
| 1 | 1 | 1 |
| 1 | 0 | 1 |
| 0 | 1 | 0 |
| 0 | 0 | 0 |

↓ IOB

FIG. 16C

| WOT | WET | W3T |
|---|---|---|
| 0 | 0 | 0 |
| 0 | 1 | 0 |
| 1 | 0 | 0 |
| 1 | 1 | 1 |

↓ IOT

| WOB | WEB | W3B |
|---|---|---|
| 1 | 1 | 1 |
| 1 | 0 | 1 |
| 0 | 1 | 1 |
| 0 | 0 | 0 |

↓ IOB

WRITTEN FOUR-VALUE DATA

FIG. 24

[READ 2]
[READ 1] [READ 3]

|     | R1T | R2T | R3T | XT | YT |
|-----|-----|-----|-----|----|----|
| SL1 | 1   | 1   | 1   | 0  | 0  |
| SL2 | 0   | 1   | 1   | 0  | 1  |
| SL3 | 0   | 0   | 1   | 1  | 0  |
| SL4 | 0   | 0   | 0   | 1  | 1  |

[READ 2]
[READ 1] [READ 3]

|     | R1B | R2B | R3B | XB | YB |
|-----|-----|-----|-----|----|----|
| SL1 | 0   | 0   | 0   | 1  | 1  |
| SL2 | 1   | 0   | 0   | 1  | 0  |
| SL3 | 1   | 1   | 0   | 0  | 1  |
| SL4 | 1   | 1   | 1   | 0  | 0  |

NONVOLATILE SEMICONDUCTOR MEMORY DEVICE WHICH STORES MULTI-VALUE INFORMATION

BACKGROUND OF THE INVENTION

The present invention relates generally to a non-volatile semiconductor memory device. More particularly, the present invention relates to a non-volatile semiconductor memory device which makes it possible to store four-value information (two-bit information) in one memory cell and increases a memory capacity. The present invention relates to a technology which will be useful when applied to an electrically rewritable non-volatile semiconductor memory device such as a flash memory.

A conventional non-volatile semiconductor memory device capable of storing information by injecting an electron into a floating gate, such as a flash memory, is described, for example, in "1994 Symposium on VLSI Circuits Digest of Technical Papers", pp. 61–62. Each of the (1) erase, (2) write, (3) write verify and (4) read operations of this conventional flash memory will be explained.

FIG. 35 of the accompanying drawings shows a principal circuit portion of memory cells MC connected to a word line WL and a bit line BL so as to explain the operations of a flash memory for storing two-value information (one-bit information) in one memory cell. Reference numerals N9 to N12 denote NMOS transistors for executing a switch operation (hereinafter merely called the "NMOS switch"). A source line is represented by symbol SOL.

The state where electrons are injected to the floating gate of the memory cell MC and the threshold voltage of this memory cell MC (Vth0) is high will be assumed as the erase state, that is, the state where the written information is "0". On the contrary, the state where the electron is not injected into the floating gate and the threshold voltage of the memory cell MC is low (Vth1) will be assumed as a written state, that is, the state where the written information is "1".

FIG. 36 typically shows a threshold voltage distribution of the memory cell when the memory cell latches the two-value information in this way.

(1) Erase Operation:

In this example, the erase operation is made for each word line. The erase operation is carried out by setting the word line WL to 12 V, for example, and applying −4 V, for example, to a substrate voltage VWEL of the memory cell MC and a source line SOL. In consequence, the electron are injected to the floating gate, the threshold voltage of the memory cell MC becomes high, and the erase state is established.

(2) Write Operation:

The write operation is the one that extracts the electrons in the floating gate and lowers the threshold voltage of the memory cell.

First, an input/output line IO is set to a high level (called also "High") when write is made to the memory cell MC and to a low level (called also "Low") when write is not made, and a sense latch SL is caused to latch the data of the "High" or "Low" level.

Next, the operation power source voltage VSA of the sense latch SL is raised to 4 V, for example, from the power supply voltage VCC to turn ON the NMOS switch N10. If "High" is latched by the sense latch SL at this time, the node side A of the sense latch SL is "High", so that the NMOS switch N11 is turned ON and the bit line BL is precharged to 4 V through the NMOS switches N10 and N11. If "Low" is latched by the sense latch SL, on the other hand, the node A is "Low", so that the NMOS switch N11 is OFF and the bit line BL is not precharged and falls to 0 V. Thereafter, the voltage of a control signal line PG is lowered to turn OFF the NMOS switch N10, and the control signal line TR is then raised to turn ON the NMOS switch N12. The word line WL is set to −9 V, for example, and the write operation is carried out. At this time, the source line and the substrate voltage VWEL of the memory cell MC are kept at 0 V. The voltage of the control signal line TR is then lowered to turn OFF the NMOS switch N10 to set the word line W to 0 V, the control signal line DDC is raised to turn ON the NMOS switch N9 and to discharge the bit line BL. The voltage of the control signal line DDC is lowered to turn OFF the NMOS switch N9, and the next write verify operation is carried out.

(3) Write Verify Operation:

In the write verify operation, the voltage VSA is first set to 1 V, for example, to raise the control signal line PG and turn ON the NMOS switch N10. As described in the (2) write operation, if "High" is latched in the sense latch SL, the NMOS switch N11 is turned ON, and the bit line BL is precharged to 1 V. If "Low" is latched, the NMOS switch N11 is turned OFF, so that the bit line BL is not precharged. Next, the voltage of the control signal line PG is lowered to turn OFF the NMOS switch N10. If the word line WL is 1.5 V, and the source line and the substrate voltage VWEL of the memory cell MC are 0 V, for example, the memory cell MC is turned ON if its threshold voltage is low, a current flows from the bit line BL to the source line side and hence, the potential of the bit line BL drops, due to the (2) write operation. If the threshold voltage of the memory cell MC is not under the low state by the (2) write operation, on the other hand, the memory cell MC is not turned ON and the potential of the bit line BL does not drop.

After the voltage of the word line is returned to 0 V, the control signal line TR is raised to turn ON the NMOS switch N12. If the potential of the bit line BL lowers at this time, the potential of the node A lowers, too, and "High" latched by the sense latch SL inverts to "Low". If the potential of the bit line BL does not lower, however, the potential of the node A does not lower and "High" latched by the sense latch SL remains "High" and does not lower.

When the (2) write operation is made to the memory cell MC and the threshold voltage of the memory cell MC lowers (the state where "1" is written), "High" latched by the sense latch SL inverts to "Low" due to the write verify operation and the write operation is judged as being finished. In contrast, when the threshold voltage of the memory cell MC remains high due to the (2) write operation (the state where "0" is written), the operations (2) and (3) are repeated until the sense latch SL inverts from "High" to "Low".

(4) Read Operation:

First, the control signal line DDC is raised to turn ON the NMOS switch N9 and the bit line BL is discharged. Next, the voltage VSA is set to 1 V, for example, to raise the control signal line SET and to turn ON the NMOS switch N13. The node side A of the sense latch circuit SL is set to 1 V and the control signal line TR is raised. The NMOS switch N12 is turned ON and the bit line BL is precharged to 1 V. The voltage of the control signal line TR is lowered, the NMOS switch N12 is turned OFF, the voltage of the SET line is lowered and the NMOS switch N13 is turned OFF. The substrate voltage VWEL and the voltage of the source line are then set to 0 V, for example, and the word line WL is set to the power supply voltage VCC. When the threshold voltage of the memory cell MC is low, the memory cell MC is turned ON, a current flows from the bit line BL to the source line side and the potential of the bit line BL drops. When the threshold voltage of the memory cell MC is high, the memory cell MC is not turned ON and the potential of the bit line BL does not drop. Next, after the voltage of the word line WL is set to 0 V, the control signal line TR is raised and the NMOS switch N12 is turned ON. If the memory cell MC is turned ON, the potential of the bit line BL is low. Therefore, the potential of the node A is low, too. If the memory cell MC is not turned ON, on the other hand, the potential of the bit line BL does not drop, and the potential of the node A does not drop, either. In this way, the information stored in the memory cell MC, that is, the information corresponding to the case where the threshold voltage is low (the state where "1" is written) and the case where it is high (the state where "0" is written), is read read out.

A greater memory capacity and a smaller area have been desired for non-volatile semiconductor memory devices. As described above, however, when only one-bit information can be stored in one memory cell, the number of memory cell arrays must be increased to achieve a greater capacity. For this reason, in order to achieve a greater capacity in the non-volatile semiconductor memory devices, the chip area must be inevitably increased irrespective of the progress of the micro fabrication technology in the technical field of the semiconductor integrated circuits.

SUMMARY OF THE INVENTION

The present invention is directed to make it possible to store four-value information (two-bit information) in one memory cell.

Another object of the present invention is to increase a capacity of a non-volatile semiconductor memory cell and to reduce the increase of a chip area with the increase of the capacity.

These and other objects and novel features of the present invention will become more apparent from the following detailed description of the invention in conjunction with the accompanying drawings.

Among the inventions disclosed in this application, the following will briefly illustrate some typical inventions.

In the verify operation, in brief, the write operation is effected by serially applying three different kinds of voltages to the word line so as to control the threshold voltage of the memory cell, the two-value (one-bit) write data corresponding to the four-value (two-bit) information to be written are synthesized by a write data conversion circuit (1) for each of the write operations carried out three times, and the four-value (two-bit) information is written to one memory cell. To read the stored information, three different kinds of voltages are applied to the word line, the three kinds of two-value (one-bit) information so read out are synthesized by a read conversion circuit (2) and the stored information of the memory cell is converted to two-bit information.

More particularly, when the data of an electrically erasable and writable non-volatile memory cell (MC) is rewritten, a non-volatile semiconductor memory device for controlling the non-volatile memory cell (MC) to an erase state, a first write state, a second write state or a third write state each having a different threshold voltage and making it possible for one memory cell to store four-value information, includes write control means (12) for controlling each of the first write operation ("write 1") for selectively setting the non-volatile memory cell under the erase state to the first write state, the second write operation ("write 2") for selectively setting the non-volatile memory cell to the second write state after the first write operation and the third write operation ("write 3") for selectively setting the non-volatile memory cell to the third write state after the second write operation, and a write data conversion circuit (1) for generating one-bit write information deciding whether or not the non-volatile memory cell is set to the first write state by the first write operation, one-bit write information deciding whether or not the non-volatile memory cell is set to the second write state by the second write operation and one-bit write information deciding whether or not the non-volatile memory cell is set to the third write state by the third write operation, from two-bit write data given from outside. The memory device includes further data latch means (sense latch SL) for latching the write information so generated by the write data conversion circuit as to correspond to each of the first to third write operations, for each of these first to third write operations, and for selecting whether or not the memory cell is set to the corresponding write state for each of the first to third write operations.

When the memory cell is connected to the bit line and has a sense latch whose memory node is connected to the bit line and a switch device for selectively connecting the bit line to an input/output line, the data latch means described above can be constituted to a sense latch (SL) (which is connected to the bit line selected by the switch device.

When the threshold voltage of the non-volatile memory cell under the erase state, the first write state, the second write state and the third write state are Vth0, Vth1, Vth2 and Vth3 from the higher side, respectively, the write verify voltages Vv1, Vv2 and Vv3 in the first to so set as to satisfy the relation Vth1<Vv1<Vth0, Vth2<Vv2<Vt1 and Vth3<Vv3<Vth2.

When the erase state, the first write state, the second write state and the third write state of the non-volatile memory cell are assumed to correspond to "00", "01", "10" and "11" of the two-bit write data, for example, the write data conversion circuit sets the write information in each of the first to third write operations to a write non-select level ("0") in accordance with the first state ("00") of the two-bit write data, sets the write information in the first write operation to a write select level ("1") and the write information in each of the second and third write operations to the write non-select level ("0") in accordance with the second state ("01") of the two-bit write data, sets the write information in each of the first and second write operations to the write select level ("1") and the write information in the third write operation to the non-select level ("0") in accordance with the third state of the two-bit write data, and sets the write information in each of the fist to third write operations to the write select level ("1") in accordance with the fourth state of the two-bit write information.

In this way, the threshold voltages of the memory cell are controlled by dividing the write verify voltage into three kinds and dividedly conducting the write operations, and the two-value (one-bit) write data are generated in such a manner as to correspond to the write four-value (two-bit) information in each of the write operations carried out thrice. Accordingly, the four-value (two-bit) information can be written into one memory cell. In other words, the memory capacity of the non-volatile memory cell can be doubled.

In order to make it possible to read the four-value (two-bit) information store din the way described above to the outside as the two-value (one-bit) information, the non-volatile semiconductor memory device includes a read control means (12) for controlling each of the first read operation for selecting the memory cell in accordance with a word line select level between the threshold voltage of the non-volatile memory cell under the erase state and the threshold voltage under the first write state, the second read operation for selecting the memory cell in accordance with the word line select level between the threshold voltage of the non-volatile memory cell under the first write state and the threshold voltage under the second write state, and the third read operation for selecting the memory cell in accordance with the world line select level between the threshold voltage of the non-volatile memory cell under the second write state and the threshold voltage under the third write state, and a read data conversion circuit (2) for generating two-bit read data representing to which of the erase state, the first write state, the second write stage and the third write state the state of the memory cell as the read object corresponds, from the one-bit information obtained by each of the first to third read operations by the read control means.

When the threshold voltages of the non-voltage memory under the erase state, the first write state, the second write state and the third write state are Vth0, Vth1, Vth2 and Vth3 from the higher side, the word line select levels Vr1, Vr2 and Vr3 in the first to third read operations can be so set as to satisfy the relation Vth1<Vr1<Vth0, Vth2<Vr2<Vth1 and Vth3<Vr3<Vth2.

Assuming that the erase state, the first write state, the second write state and the third write state of the non-volatile memory cells correspond to the states of the two-bit write data "00", "01", "10" and "11", respectively, the read data conversion circuit outputs the two-bit read data as the first state ("00") when the three-bit information obtained by the first to third read operations all have the first logic value ("0"), outputs the two-bit read data as the second state ("01") when the one-bit information obtained by the first read operation has the second logic value ("1") while the two-bit information obtained by the second and third read operations all have the first logic value ("01"), outputs the two-bit read data as the third state ("10") when the two-bit information obtained by the first and second read operations have the second logic value ("1") while the two-bit information obtained by the third read operation has the first logic value ("0"), and outputs the two-bit read data as the fourth state ("11") when the two-bit information obtained by the first to third read operations all have the second long value ("1").

When three kinds of voltages are set as the word line select level to be applied to the word line in the read operation and the two-value (one-bit) data read out from the memory cell by the read operations carried out three times are applied to the read data conversion circuit 2 as described above, the read conversion circuit can convert the memory information of the memory cell to a two-bit data string and can output this data string.

As will be later described in detail with reference to FIGS. 10 and 11, after the operation which applies a write pulse for giving a voltage for taking the charge into and out from the memory cell to each memory cell is made, a voltage is applied to the control gate so as to judge whether or not the memory cell has a required threshold voltage, and this judgement is made on the basis of the value of a current flowing through the memory cell at this time. These operations constitute a cycle, and when this cycle is repeated a plurality of times, the width of the write pulse or the absolute value of the pulse voltage is preferably increased. If such operations are conducted at the same write pulse, it becomes more difficult to take the charge into and out from the memory cell as the cycle is repeated, but the means described above can particularly improve the write operation speed.

Preferably, the threshold voltages are set so that among a plurality of threshold voltages that can be set to one memory cell ni such a manner as to correspond to a plurality of bit information, the threshold voltages are preferably set so that the Hamming distance between the information corresponding to the adjacent threshold voltages becomes minimal.

If a plurality of bit information are two bits in this case, for example, the corresponding information may be set to "00", "01", "11" and "10" from the lowest side or the highest side of the four threshold voltages that can be so set to one memory cell as to correspond to the two-bit information. According to such a definition of the bit information, any error of data due to the change of the threshold voltage remains the error of one bit at most, and subsequent data correction becomes easier. In other words, if any data error exists, "11" changes to the data "01" or "10". Therefore, the error can be corrected to a correct data by correcting only one bit.

The threshold voltage of the memory cell after the irradiation of ultra-violet rays or the threshold voltage under a thermal equilibrium state can be set to a voltage in the proximity of the lowest or highest threshold voltage among the four threshold voltages that can be set. The threshold voltage is likely to change to the threshold voltage under the thermal equilibrium state. Therefore, when the threshold voltage under the thermal equilibrium state is set to a voltage near the lowest threshold voltage, the data can be written at a high speed. When it is set to a voltage near the highest threshold voltage, the data can be erased at a high speed. As will be explained later with reference to FIGS. 6 to 9, the number of times of the data write operations is greater. Therefore, when the threshold voltage under the thermal equilibrium state is set to the voltage near the low set threshold voltage, through-put of the apparatus can be presumably improved.

In another embodiment of the present invention, the threshold voltage Vth under the thermal equilibrium state is set near the center of the distribution of the threshold voltage. Assuming that the threshold voltages are V1, V2, V3 and V4, the threshold voltage under the thermal equilibrium state is set between V2 and V3. According to this method, the potential differences are small between V1 and Vth and between V4 and Vth. Therefore, the threshold voltage is difficult to change. Further preferably, the threshold voltage under the thermal equilibrium state is set between the threshold voltages providing the greatest Hamming distance between the information corresponding to the threshold voltages. For example, when "00", "01", "10" and "11" correspond to the threshold voltages from the higher side or the lower side, the threshold voltage of the memory cell after the irradiation of the ultra-violet rays may be set between "01" and "10". In other words, since the thermal equilibrium state exists between the threshold voltages corresponding to "01" and "10", it may be interpreted that the transition of the data does not occur between "01" and "10".

BRIEF DESCRIPTION OF THE DRAWINGS

FIGS. 16A to 16C are explanatory views showing an example of the synthesis result by the write data synthesis circuit shown in FIG. 15 in such a manner as to correspond to "write 1" to "write 3", respectively;

FIG. 24 is an explanatory view showing an example of the output result by the read data synthesis circuit;

DESCRIPTION OF THE PREFERRED EMBODIMENTS

Figure 1:
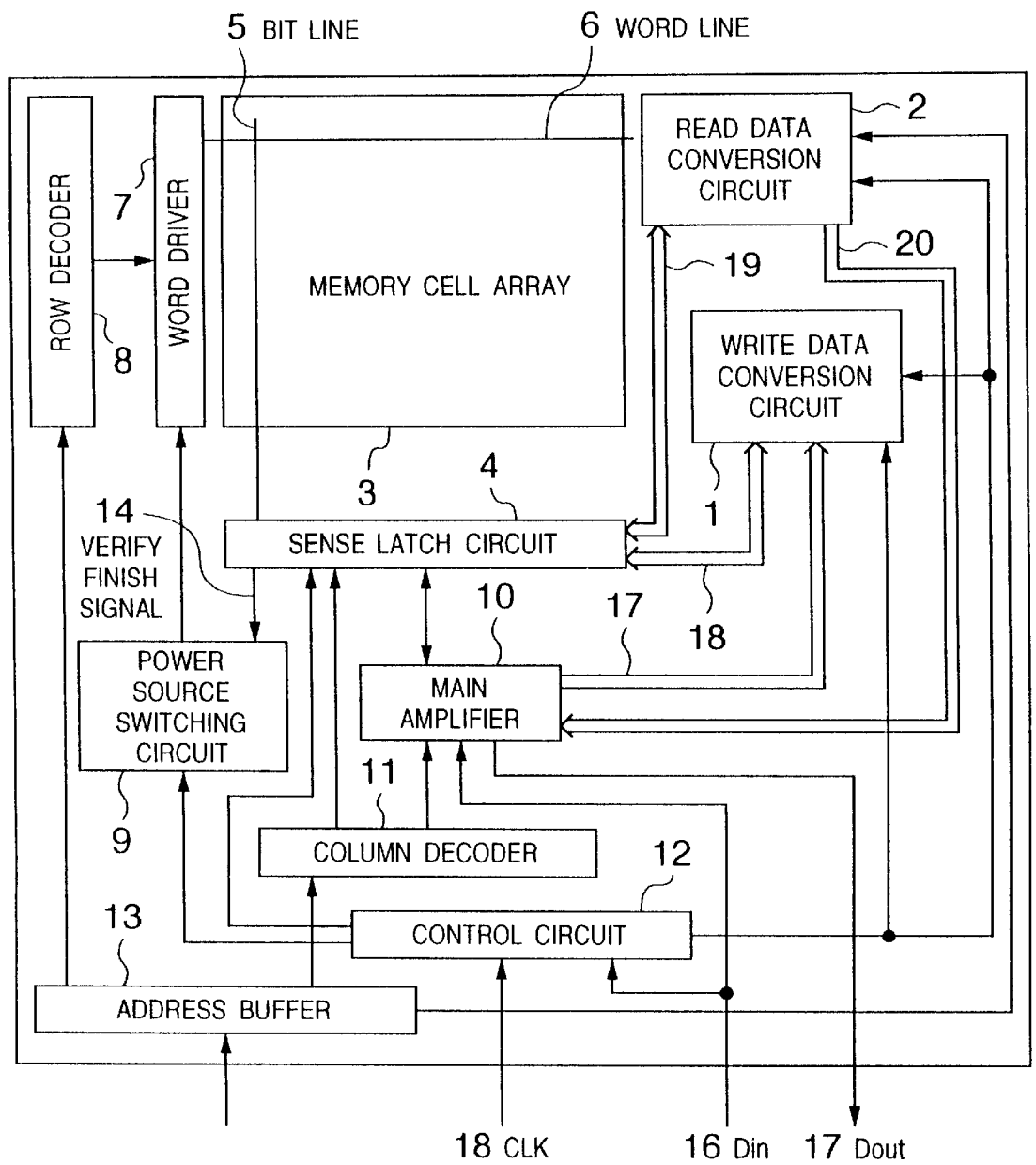
FIG. 1 is a block diagram of a flash memory according to the first embodiment of the present invention.

FIG. 1 shows the overall construction of a flash memory according to the first embodiment of the present invention which can write two-bit information into one memory cell and can read out this information.

A memory cell array 3 has a large number of memory cells, each having a floating gate and a control gate. The control gate of each memory cell is connected to a word line 6, its drain is connected to a bit line 5 and its source is connected, to a source line which is not shown in the drawings. One each word line 6 and bit line 5 are exemplarily shown in the drawing. A word driver 7 drives the word lines on the basis of a select signal outputted from a row decoder 8. A sense latch circuit 4 is disposed on one of the sides of the bit lines 5. These bit lines 5 are selected by a column switch circuit on the basis of a select signal outputted from a column decoder 11, and the selected bit line is connected to a main amplifier 10.

It is to be understood that the column switch circuit shown in FIG. 1 is included in the sense latch circuit 4. An address signal is supplied from an address buffer 13 to the column decoder 11 and to the row decoder 8. A power switching circuit 9 changes over the operation voltages of the word driver 7, etc, necessary for the operation modes such as erase, write and read modes. A control circuit 12 receives from outside an access control signal, not shown, and a clock signal 18, and collectively controls the internal circuits of the flash memory in order to execute the write control and the read control of the memory cells in accordance with such signals. Though not particularly limited, the operation modes of the flash memory are designated by an access control signal supplied from outside to the control circuit 12 or by command data supplied to the control circuit 12 through a data bus, and include the data re-write (erase and write) mode and the data read mode.

In the information memory device technology which the flash memory shown in FIG. 1 contemplates to accomplish, the information memory state of one memory cell is one state selected from the erase state, the first write state, the second write state and the third write state. These four information memory states are determined by two-bit data. In other words, one memory cell stores two-bit data. For this reason, mutually different three kinds of verify voltages are set as the write verify voltage applied to the word line at the time of the write operation, and the write operation is executed three times by sequentially changing over these write verify voltages. In each write operation, a write data conversion circuit 1 is disposed for controlling two-value (one-bit) write data "0" or "1" ("Low" or "High") to be latched by the sense latch (sense latch contained in the sense latch circuit 4) connected to the memory cell that effects the write operation, for each of the write operations carried out three times, and four-value (two-bit) information is written into one memory cell. Further, the memory device of this invention includes a read data conversion circuit 2 which sets three kinds of voltages as the word line select levels to be applied to the word lines at the time of the read operation, inputs the two-value (one-bit) data read out from the memory cell by three times of the read operations through the sense latch circuit 4 and converts this data to four-value (two-bit) information after three times of the read operations are completed.

The outline of the write operation and the read operation will be first explained with reference to FIG. 1.

In the write operation, two-value (one-bit) data string to be written from Din 16 is amplified by the main amplifier 10 and is sent to the write data conversion circuit 1 through a signal line 17. This write data conversion circuit 1 separates the two-value (one-bit) data string to be written into odd-numbered bits and even-numbered bits, for example, transfers them to a sense latch connected to the non-selected memory cells in the memory cell array 3 (hereinafter called the "non-selected sense latch") and causes the non-selected sense latch to temporarily latch them. Such a non-selected sense latch is also used as a data buffer. The write data conversion circuit 1 inputs the data latched by the non-selected sense latch through the signal line 18 for each of the operations "write 1 (write operation for obtaining the first write state)", "write 2 (write operation for obtaining the second write state)" and "write 3 (write operation for obtaining the third write state)", converts the data to two-value (one-bit) data "0" or "1" (Low or High) corresponding to the four-value (two-bit) data to be written into the selected memory cell in accordance with "write 1", "write 2" and "write 3", and transfers the converted data to the sense latch in the sense latch circuit 4 connected to the selected memory cell (hereinafter called the "selected sense latch") through the signal line 18, so that each write operation of "write 1", "write 2" and "write 3" is executed in accordance with the two-value data so latched.

As described above, the two-value data separated into the odd-numbered bits and the even-numbered bits is temporarily latched by the sense latch of the non-selected memory cell, the two-value (one-bit) write data is synthesized by using the write conversion circuit 1 for each of three times of the write operations ("write 1" to "write 3") by mutually different verify voltages, and four-value (two-bit) information can be thus written into one memory cell by conducting the write operations having mutually different verify voltages.

In the read operation, mutually different three kinds of voltages are serially applied to the word line 6 and the two-value (one-bit) information "0" or "1" (Low or High) read out to the selected sense latch from the memory cell from the memory cell array 3 by each of the read operations carried out three times is transferred to mutually different non-selected sense latches and is temporarily stored by them. Three kinds of two-value (one-bit) data "0" or "1" ("Low" or "High") that are read out by three times of the read operations, are transferred from the selected sense latch to the non-selected sense latch and are latched are transferred to the read data conversion circuit 2 through the signal line 19. The read data conversion circuit 2 synthesizes the high order bits and the low order bits of the four-value (two-bit) data on the basis of the data so transferred. The read data conversion circuit 2 alternately outputs the high order bits and the low order bits so synthesized to form a two-value (one-bit) data string, which is amplified by the main amplifier and is outputted from Dout 17.

Incidentally, the relation between the bit information stored in the memory cell and the threshold voltage of the memory cell is preferably set so that a Hamming distance becomes minimal between informations corresponding to the adjacent threshold voltages among a plurality of threshold voltages that can be set to one memory cell corresponding to a plurality of bit informations.

It will be hereby assumed that when the bit information is two bits, the information corresponding to four threshold voltages V1, V2, V3 and V4, that can be set to one memory cell in such a manner as to correspond to the two-bit information, are serially "10", "11", "01" and "00" in this order from the lowest voltage side (or from the highest voltage side). Alternatively, they are set to "00", "10", "11" and "01". In this instance, the Hamming distance between the data corresponding to the adjacent threshold voltages becomes 1, and the circuit construction of an error correction circuit becomes simple. It is particularly preferred that the threshold voltage Vth at the time of the irradiation of ultraviolet rays (UV) to the memory cells is near the highest threshold voltage (e.g. 4 V) corresponding to the information, or near the threshold voltage at the time of electrical erasure. For, Vth is a threshold voltage under the thermal equilibrium state of the memory cell, and when the memory cell is left standing, the threshold voltage of the memory cell changes towards this Vth. Assuming that V4 is the highest voltage and Vth exists near this V4, V1 represents the memory cell which has the lowest threshold voltage and is most likely to change. When the error due to the change of the threshold voltage is corrected, the construction of the error correction circuit becomes simple by setting the Hamming distance to 1. The same effect can be obtained when Vth is set near the lowest threshold voltage (e.g. V1) on the basis of the same concept.

Figure 2:
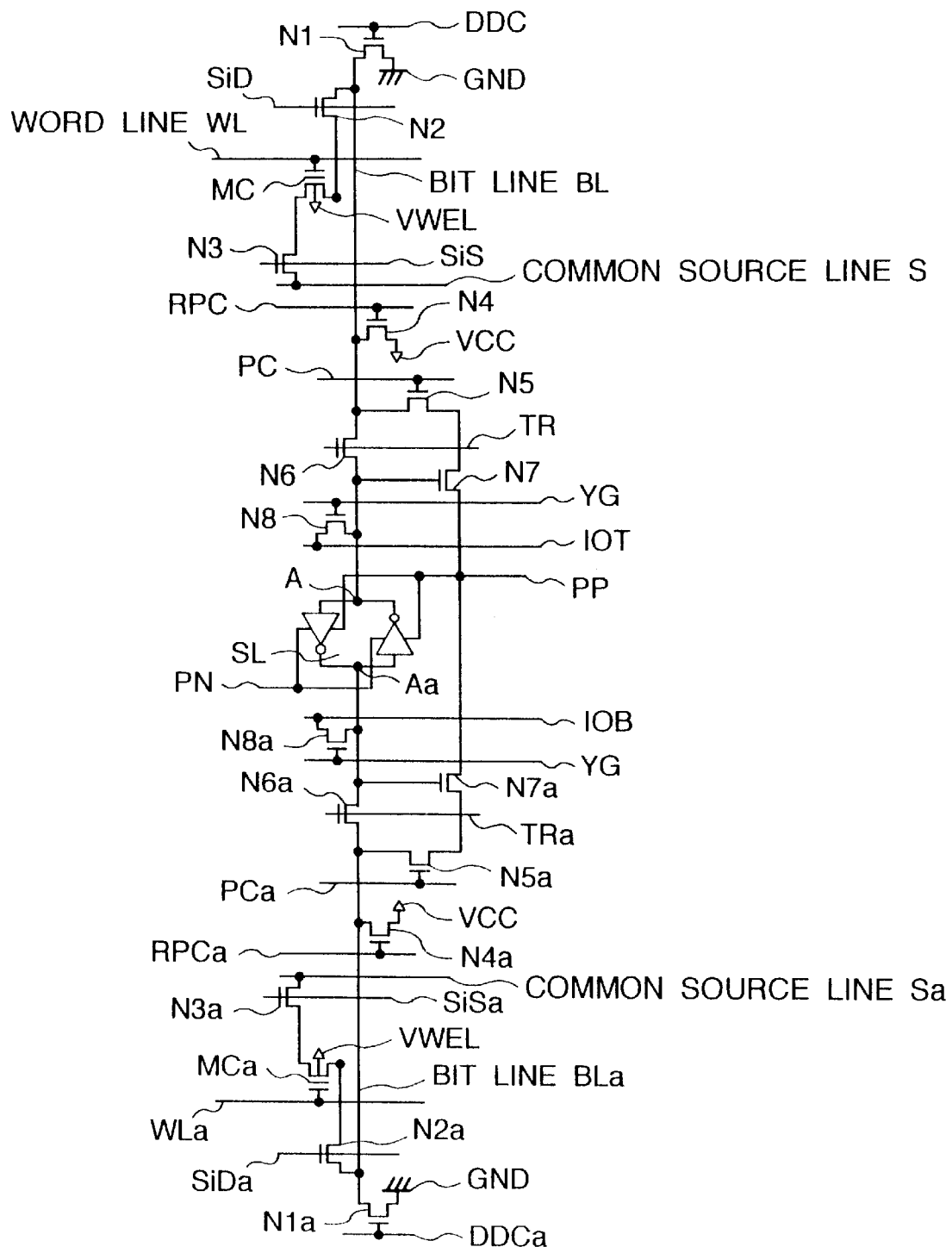
FIG. 2 is a circuit diagram showing in detail a part of the memory cell array and the sense latch shown in FIG. 1.

FIG. 2 typically shows a part of the circuit construction of the memory cell array 3 and the sense latch circuit 4 of the flash memory shown in FIG. 1. In the circuit construction shown in FIG. 2, a bit line BLa is disposed on the opposite side to the bit line BL in such a manner as to interpose the sense latch SL between them. When one bit line BLa is disposed for a plurality of bit lines BL exclusively selected, this bit line BLa is a dedicated reference bit line and the circuit construction on the side of this reference bit line BLa is a dummy circuit, though this circuit construction is not particularly limitative. Alternatively, the bit line BLa may be disposed on the 1:1 basis to the bit line BL. In this case, one of them is used as the reference bit line for the other and vice versa at the time of access and which of them is used as the reference bit line is relatively determined by the disposition of the memory cells as the access object. The control circuit 12 controls this operation.

In FIG. 2, symbols N1 to N8 and N1a to N8a represent NMOS switches, SL represents a sense latch, MC and MCa represent memory cells, VCC represents a power supply voltage, VWEL represents a substrate voltage of the memory cell, GND represents a ground potential, WL and WLa represent the word lines, BL and BLa represent the bit lines, S and Sa represent common source lines, DDC and DDCa represent control signal lines for discharging the bit lines, SiS and SiSa represent control signal lines for connecting the source of the memory cells MC and MCa to the common source lines S and Sa, respectively. RPC and RPCa represent control signal lines for precharging the bit lines at the time of the read operation, PC and PCa represent control signal lines for precharging the bits lines at the time of the verify operation, TR and TRa represent control signal lines for connecting the bit lines and the sense latches, IOT and IOB represent input/output lines, YG represents a control signal line for connecting the sense latch to the input/output line, and PP and PN represent the operation power source of the PMOS transistor and the NMOS transistor of the sense latch SL, respectively.

The bit lines BL and BLa are constituted by aluminum wirings, though not particularly limited thereto, and a series circuit of the memory cells is connected to one bit line BL, BLA, though not particularly limited thereto, either. (FIG. 2 typically shows the series circuit of the memory cells connected to one bit line). NMOS switches N2 and N2a are disposed in order to communicate one of a plurality of series circuits of the memory cells to corresponding bit line. In this way, the memory cell array 3 is constituted into a so-called "NOR type". The switching operation of these NMOS switches N2 and N2a is controlled by the control signals SiD and SiDa.

Hereinafter, the write operation and the read operation described above will be explained in further detail.

Figure 3:
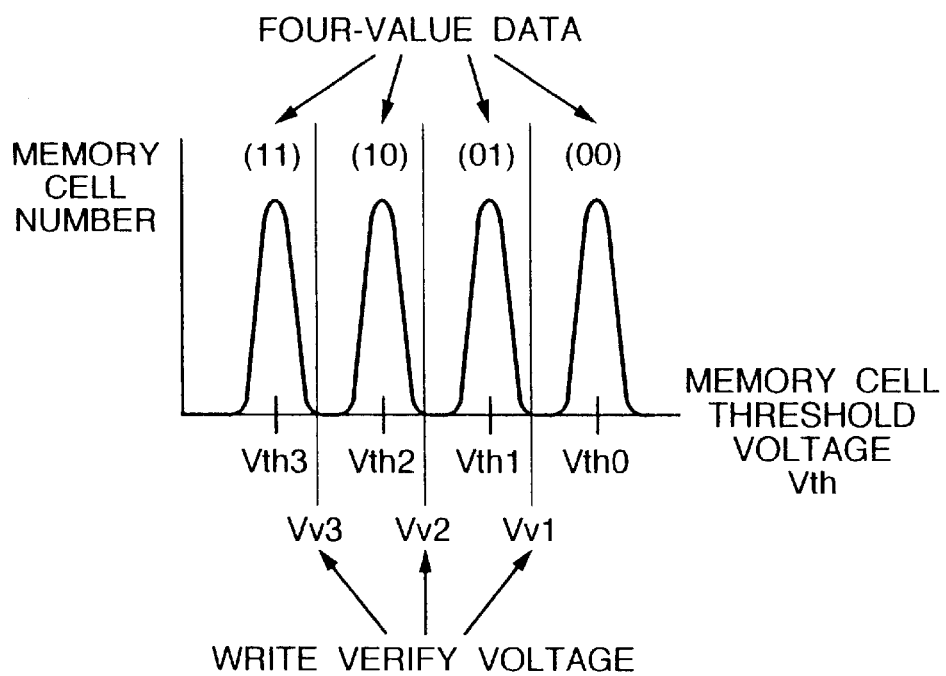
FIG. 3 is an explanatory view showing a relationship between a write verify voltage and a threshold voltage in four-value write to one memory cell.

(1) Write operation:

The construction and the function for the write and write verify operations will be explained in detail with reference to FIGS. 3 to 13. FIG. 3 shows the relationship between the voltage applied to the word line at the time of write verify and the threshold voltage distribution of the memory cell into which the four-value (two-bit) information is written. In this case, the threshold voltage of the memory cell and the four-value (two-bit) information are allowed to correspond in such a manner that the state of the highest threshold voltage Vth0 (erase state of the memory cell) corresponds to the state where the information "00" is written, the state of the second highest threshold voltage Vth1 corresponds to the state where the information "01" is written, the state of the third highest threshold voltage Vth2 corresponds to the state where the information "10" is written and the state of the lowest threshold voltage Vth3 corresponds to the state where the information "11" is written.

Figure 4:
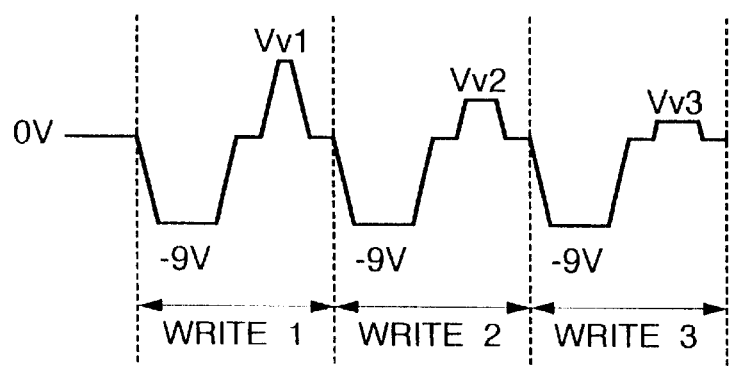
FIG. 4 is an explanatory view showing an example of a word line impressed voltage at the time of write.

To store the four-value (two-bit) information in one memory cell, the distribution of the threshold voltage of the memory cell is quadripoled as shown in FIG. 3. To control the threshold voltage distribution of the memory cell by the write operation and the write verify operation subsequent to the write operation, three kinds of voltages Vv1, Vv2 and Vv3 that satisfy the relation Vth0>Vv1>Vth1, Vth1>Vv2>Vth2 and Vth2>Vv3>Vth3 with the threshold voltages Vth0, Vth1, Vth2 and Vth3 of the four memory cells shown in FIG. 3 are applied as the write verify voltage to the word lines at the time of the write verify operation. FIG. 4 shows an example of such word line impressed voltages. Each of "write 1", "write 2" and "write 3" operations show in FIG. 4 represents the two operations, that is, one write operation and one write verify operation. One "write 1" operation makes the threshold voltage of the memory cell, into which four-value data "01", "10" and "11" are desired to be written, lower than Vv1, and one "write 2" operation makes the threshold voltage of the memory cell, into which the four-value data "10" and "11" are desired to be written, lower than VV2. Similarly, the "write 3" operation makes the threshold voltage of the memory cell, into which the four-value data "11" are desired to be written, lower than Vv3, and each of these "write 1" to "write 3" operations will be described below.

Each of these "write 1", "write 2" and "write 3" operations is in common with the operation of the circuit exemplarily shown in FIG. 2 with the exception of the two points that the erase operation is executed before the "write 1" operation, and that the voltages applied to the word lines at the time of write verify are different. Therefore, the common operation in the "write 1" to "write 3" operations and the write verify operation will be first explained.

When the data is written into the memory cell MC, the input/output line IOT on the non-invention side is set to a high level (hereinafter merely called also "High") and the input line IOB on the opposite side is set to a low level (hereinafter merely called "Low", too). In all the operations, IOT and IOB always remain the complementary signals. The control signal line YG is raised to the select level and the NMOS switches N8 and N8a are turned ON. In consequence, the "High" data is latched by the sense latch SL. At this time, the node A side of the sense latch SL is "High" and the node Aa side is "Low". Next, the power source voltage PP of the sense latch 4 on the PMOS transistor side is raised to 4 V, for example, from the power supply voltage VCC, and both control signal lines PC and PCa are raised to the select level. The NMOS switches N5 and N5a are turned ON. Since "High" is latched by the sense latch SL at this time, the NMOS switch N7 is turned on when the node A side of the sense latch A is "High", and the bit line BL is precharged to 4 V through the NMOS switch N5. Since the node Aa side of the sense latch SL is "Low", on the other hand, the NMOS switch N7a is OFF, the bit line BLa is not precharged, and the bit line BLa is set to 0 (V). The voltages of the control signal lines PC and PCa are thereafter set to the non-select level and the NMOS switches N5 and N5a are turned OFF. Next, the control signal line SiD is activated and the NMOS switch N2 is turned ON. A −9 V voltage, for example, is applied to the word line WL and the control signal lines TR and TRa are raised to the select level, so that the NMOS switches N6 and N6a are turned ON. Accordingly, the write operation is made to the memory cell. At this time, the substrate voltage VWEL of the memory cell MC is set to 0 V, for example. Thereafter, the word line WL is set to 0 V, the voltage of the control signal lines TR and TRa are lowered to the non-select level, and the NMOS switches N6 and N6a are turned OFF. Thereafter, the control signal lines DDC and DDCa are raised to the select level and the NMOS switches N1 and N1a are turned ON, so that the bit line BL as the write object and the bit line BLa no the reference side are discharged and the potentials of these bit lines BL and BLa are initialized to 0 V. The voltages of the control signal lines DDC and DDCa are lowered to the non-select level and the NMOS switches n1 and N1a are turned OFF. The following write verify operation is then carried out.

In the write verify operation, the voltage of the power supply PP of the sense latch SL on the PMOS transistor side is first set to the power supply voltage VCC, the control signal line PC is raised to the select level and the NMOS switch N5 is turned ON. When the information "1" ("High") is latched by the sense latch SL in this instance as described in connection with the write operation, the NMOS switch N7 is turned ON and the bit line BL is precharged but when the information "0" ("Low") is latched, the NMOS switch N7 is turned OFF, so that the bit line BL is not precharged. The control signal line RPCa is raised to the select level and the NMOS switch N4a is turned ON. In consequence, the bit line BLa on the reference side is precharged to a voltage lower than the bit line BL. Next, the voltages of the control signal lines PC and RPCa are lowered to the non-select level and after the NMOS switches N5 and N4a are inverted to the OFF state, the power supply PP of the sense latch SL on the PMOS transistor side is set to VSS (power supply voltage on the low potential side such as a ground potential) while the power supply PN on the NMOS transistor side is set to VCC (power supply voltage on the high potential side), so that the sense latch SL is discharged.

Next, the control signal lines SiD and SiS are raised to the select level, the NMOS switches N2 and N3 are turned ON and any one of the verify voltages Vv1, Vv2 and Vv3 is applied to the word line WL. At this time, the source line S and the substrate voltage VWEL of the memory cell Mc are set to 0 V. When the threshold voltage of the memory cell Mc is lower than the select level of the word line due to this write operation, the memory cell MC is turned ON, a current flows from the bit line BL to the source line S, and the potential of the bit line BL lowers. On the other hand, when the threshold voltage of the memory cell MC is not lower than the select level of the word line due to the write operation, the memory cell MC is not turned ON and the potential of the bit line BL does not drop. After the voltage of the word line is returned to 0 V, the voltage of the control signal lines SiD and SiS is lowered to turn OFF the NMOS switches N2 and N3, the NMOS switches N6 and N6a are turned ON by raising the control signal lines TR and TRa to the select level and the power supply PP of the sense latch SL on the PMOS transistor side is set to VCC while the power supply PN on the NMOS transistor side is set to VSS to activate the sense latch SL, so that the sense latch SL amplifies the potential difference between the bit line BL and the bit line BLa on the reference side. When the memory cell Mc is turned ON at this time, the potential on the bit line BL side drops and when the level becomes lower than the bit line BLa on the reference side, "High" latched by the sense latch inverts to "Low". When the memory cell is turned OFF, the potential of the bit line BL does not drop, and since the level is higher than the bit line BLa on the reference side, "High" latched by the sense latch SL remains "High" and does not invert. Due to this verify operation, the write operation and the write verify operation are repeated until "High" latched by the sense latch SL inverts to "Low". The control circuit 12 executes the operation control of each of these write and write verify operations.

Next, the control method of the threshold voltage of the memory cell in the four-value (two-bit) write operation to the memory cell Mc will be explained. This control method makes it possible to write four-value (two-bit) into one memory cell as described below by serially converting the write data to two-value (one-bit) signal "0" or "1" ("Low" or "High") corresponding to the four-value (two-bit) data in accordance with the write operations made three times by using the non-select sense latch by the later-appearing write conversion circuit.

Figure 5:
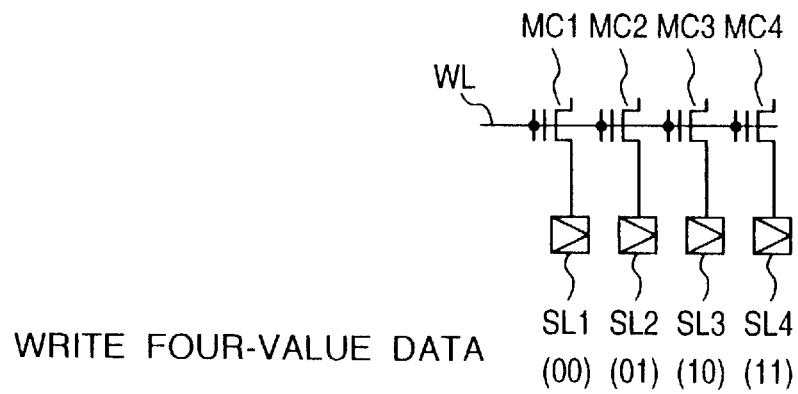
FIG. 5 is an explanatory view showing a correspondence relationship between four memory cells and four-value write data written to each memory cell for explaining an example of write of four-value data.

Let's assume the case where the four-value data "00", "01", "10" and "11" are written into the four memory cells MC1, MC2, MC3 and MC4 connected to one word line WL as shown in FIG. 5. These four-value data "00", "01", "10" and "11" are obtained by dividing one-bit data string "00011 011" by two bits. Generally, eight memory cells are necessary for writing these eight data, but the one-bit data string is divided by two as described above to obtain the four-value (two-bit) data "00", "01", "10" and "11", and each of them is written into one memory cell. In this way, only four memory cells are necessary, and the memory capacity can be doubled.

Figure 6:
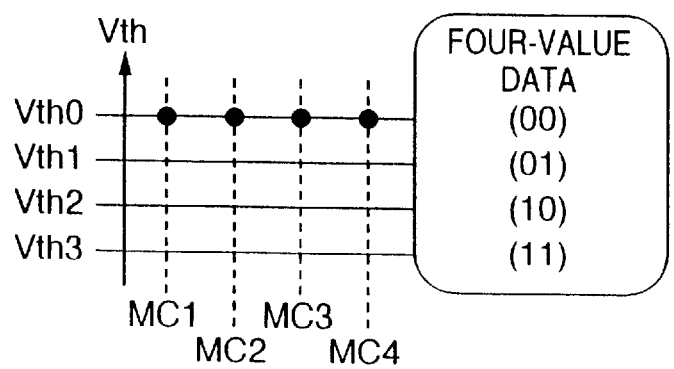
FIG. 6 is an explanatory view showing the threshold voltages of four memory cells when all the four memory cells are erased as the first stage for obtaining the write state shown in FIG. 4.

First, the erase operation is carried out before the write operation, and the threshold voltages of the memory cells M1 to MC4 are alighted to high Vth0 (FIG. 6). The erase operation will be explained with reference to FIG. 2. For example, 12 V and –4 V are applied to the word line WL and the substrate voltage VWEL of the memory cell MC, –4 V is applied to the common source line S to raise the control signal line SiS to the select level, the NMOS switch N3 is turned ON and the source side of the memory cell Mc is set to –4 V. In this way, the electron is injected into the floating gate of the memory cell MC as the erase object and the threshold voltage of the memory cell MC enters the high state. Thereafter, the write and write verify operations are carried out. It will be assumed that the voltage shown in FIG. 4 is applied at this time to the word line WL.

Figure 7:
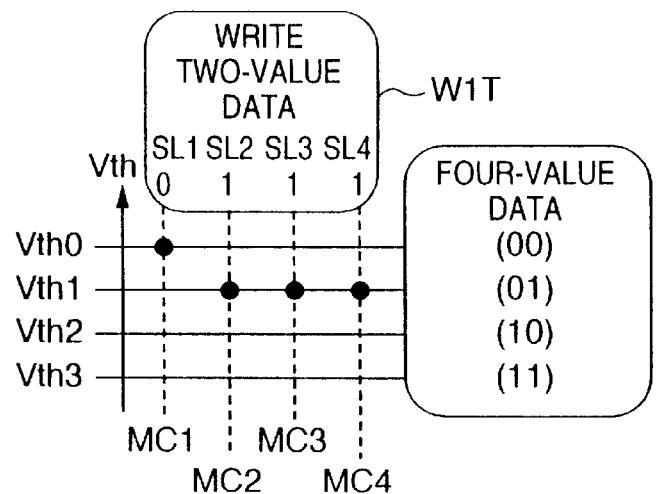
FIG. 7 is an explanatory view showing the change of the threshold voltage of the memory cell obtained by "write 1" after all the four memory cells are erased as the second stage for obtaining the write state shown in FIG. 4.

In the "write 1" operation, the write two-value data W1T are latched by the sense latches SL1 to SL4 connected to the memory cells MC1 to MC4, respectively. In other words, the sense latch SL1 connected to the memory cell MC1 is set to "Low" ("0" is latched), and the sense latches SL2 to SL4 connected to the other memory cells MC2 to MC4 are set to "High" ("1" is latched), respectively. In this way, the write operation is made to the memory cells MC2 to MC4. Thereafter, the write write verify operations that have been described already are conducted by setting the word line voltage to –9 V at the time of write, for example, and to Vv1 at the time of write verify. When the threshold voltages of the memory cells MC2 to MC4 reach Vth1 as shown in FIG. 7, this "write 1" operation is completed, and the "write 2" operation is consecutively carried out.

Figure 8:
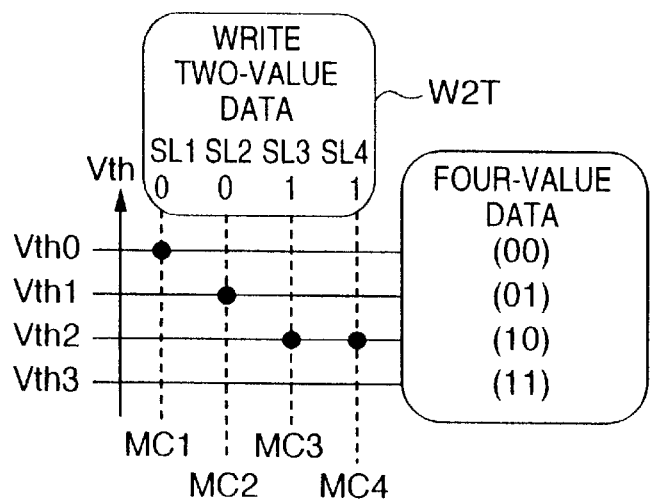
FIG. 8 is an explanatory view showing the change of the threshold voltage of the memory cell obtained by "write 2" as the third stage for obtaining the write state shown in FIG. 4.

In the "write 2" operation, the write two-value data W2T are latched by the sense latches SL1 to SL4 connected to the memory cells MC1 to MC4, respectively. In other words, the sense latches SL1 and SL2 connected to the memory cells MC1 and MC2 are set to "Low" ("0" is latched) and the sense latches SL3 and SL4 connected to the other memory cells MC3 and MC4 are set to "High" ("1" is latched) so as to write the memory cells MC3 and MC4. Thereafter, the write and write verify operations are carried out in the same way as in the "write 1" operation by setting the word line voltage to –9 V, for example, at the time of write and to Vv2 at the time of write verify. As shown in FIG. 8, the "write 2" operation is completed when the threshold voltages of the memory cells MC3 and MC4 reach Vth2 and the "write 3" operation is consecutively carried out.

Figure 9:
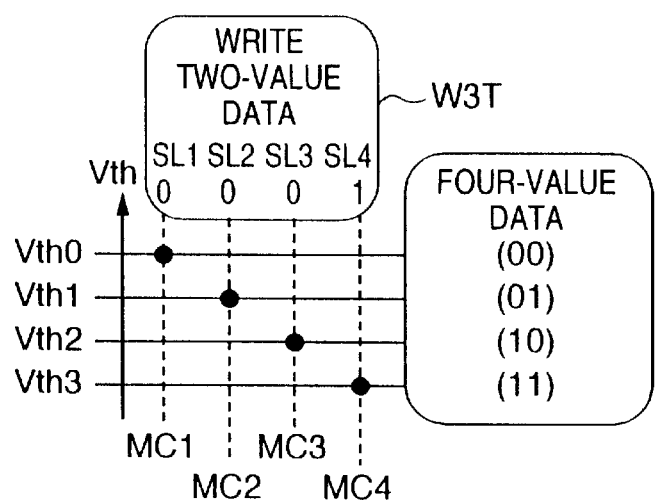
FIG. 9 is an explanatory view showing the change of the threshold voltage of the memory cell obtained by "write 3" as the fourth stage for obtaining the write state shown in FIG. 4.

In the "write 3" operation, the write two-value data W3T are first latched by the sense latches SL1 to SL4 connected to the memory cells MC1 to MC4, respectively. In other words, the sense latches SL1 to SL3 connected to the memory cells MC1 to MC3 are set to "Low" ("0" is latched) and the sense latch SL4 connected to the memory cell MC4 is set to "High" ("1" is latched) so as to write only the memory cell MC4. Thereafter, the write and write verify operations are carried out by setting the word line voltage to −9 V, for example, at the time of write and to Vv3 at the time of write verify in the same way as in the "write 1" and "write 2" operations. As shown in FIG. 9, the "write 3" operation is completed when the threshold voltage of the memory cell MC4 reaches Vth3, and in this way, all the write operations are completed. The four-value (two-bit) information "00", "01", "10" and "11" are thus written into the memory cells MC1 to MC4, respectively. As described above, because the "write 1" to "write 3" operations are carried out three times by setting the word line voltage to Vv1 to Vv3 at the time of write verify, the four-value (two-bit) information can be written into one memory cell.

Figure 10:
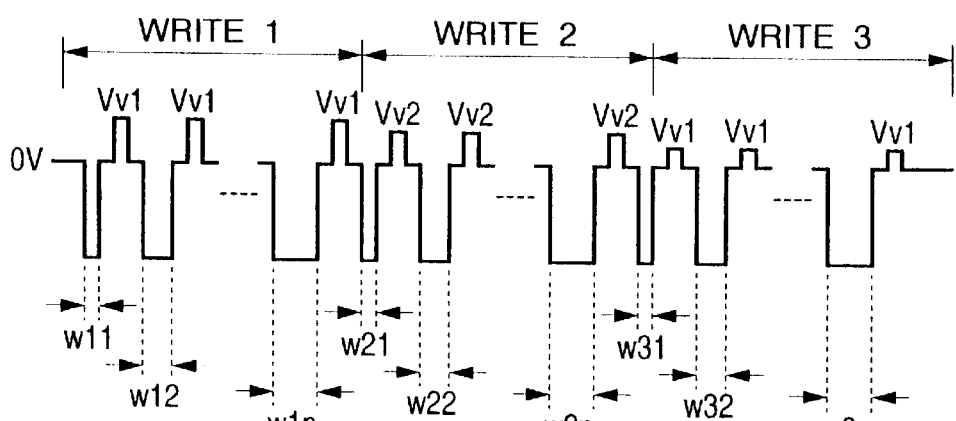
FIG. 10 is an explanatory view showing an example of a voltage waveform when a write pulse width is progressively increased as a mode of applying the write voltage.
Figure 11:
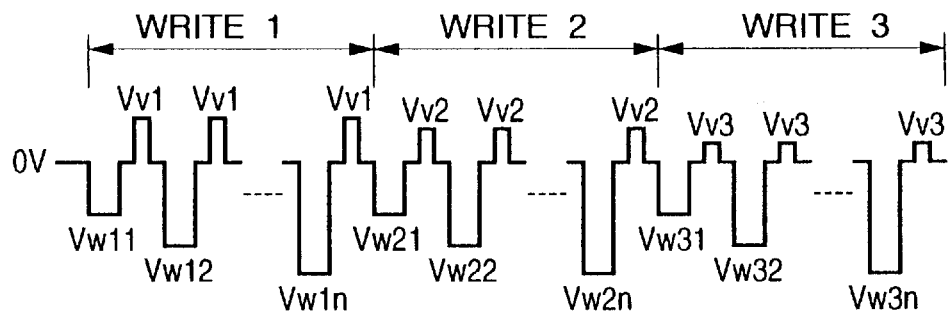
FIG. 11 is an explanatory view showing another example of the voltage waveform when a write pulse voltage is progressively increased as another mode of applying the write voltage.

The example of the application of the word line voltage shown in FIG. 4 represents the case where the write verify operation is effected once after the write operation at each stage ("write 1" to "write 3" operations) to obtain a predetermined threshold voltage. Systems shown in FIGS. 10 and 11 can be employed, too, as the application form of the write voltage to the word line besides the application system shown in FIG. 4. The system shown in FIG. 10 represents the control which gradually increases the application of the write voltage to be effected once, that is, the write pulse width. The system shown in FIG. 11 represents the case where the write pulse width is kept constant and the write voltage level is so controlled as to gradually increase.

Next, the conversion system from the two-value (one-bit) write data string to two-value data W1T to W3T, and their complementary signals W1B and W3B, for the four-value (two-bit) write operation in the "write 1" to "write 3" operations will be explained.

Figure 12:
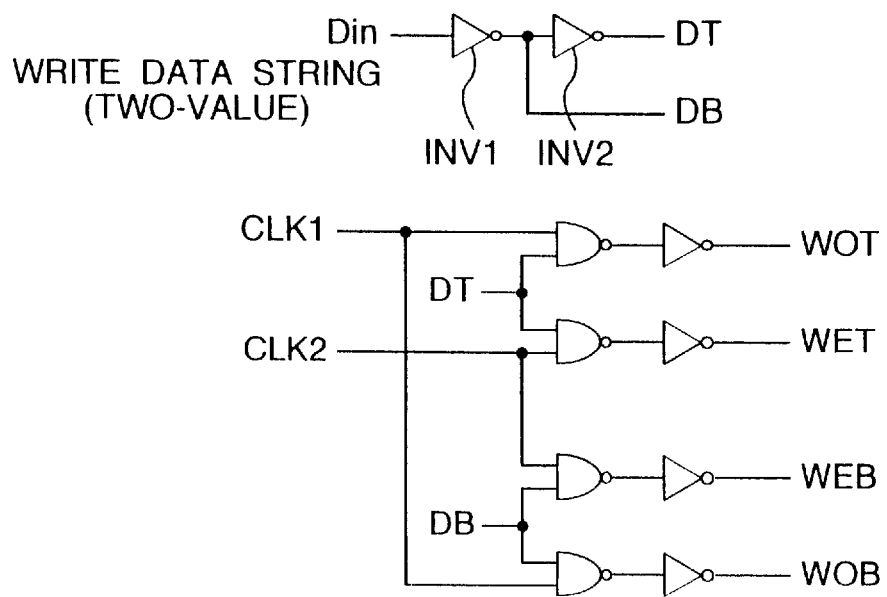
FIG. 12 is a logic circuit diagram showing an example of the circuit for separating the write data into even-numbered bits and odd-numbered bits.

FIG. 12 shows an example of a circuit for separating the two-value (one-bit) write data string into odd-numbered and even-numbered bits. The feature of the circuit shown in this drawing resides in that after the two-value data string to be written is separated into DT and DB complementary signals, they are separated into WOT and WOB of the odd-numbered bits (where WOT and WOB are mutually complementary signals) and WET and WEB of the even-numbered bits (where WET and WEB are mutually complementary signals) by clock signals having cycles which are deviated from each other by a half cycle.

Figure 13:
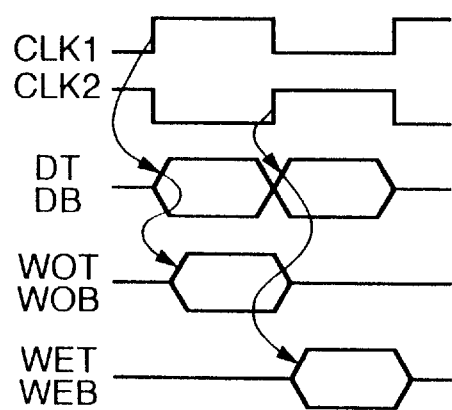
FIG. 13 is a timing chart showing an example of the operation of the circuit shown in FIG. 12.

The operation of the circuit shown in FIG. 12 will be explained with reference to FIG. 13. FIG. 13 shows an exemplary case where two-value (one-bit) write data string is continuously inputted in the series of "1" and "1" ("High" and "High") to a data input terminal (Din) 16 of a flash memory. The inputted write data string is separated into the DT and DB complementary signals by inverter circuits INV1 and INV2 and the signals DT and DB so separated are then synchronized with clock signals CLK1 and CLK2 whose cycles are deviated by a half cycle, forming thereby set of mutually complementary signals WOT and WOB (odd-numbered bits) and WET and WEB (even-numbered bits), respectively. In this example, conversion to the complementary signals corresponds to the condition that the input of the sense latch is differential or complementary signals, and this circuit arrangement is not always necessary.

Figure 14:
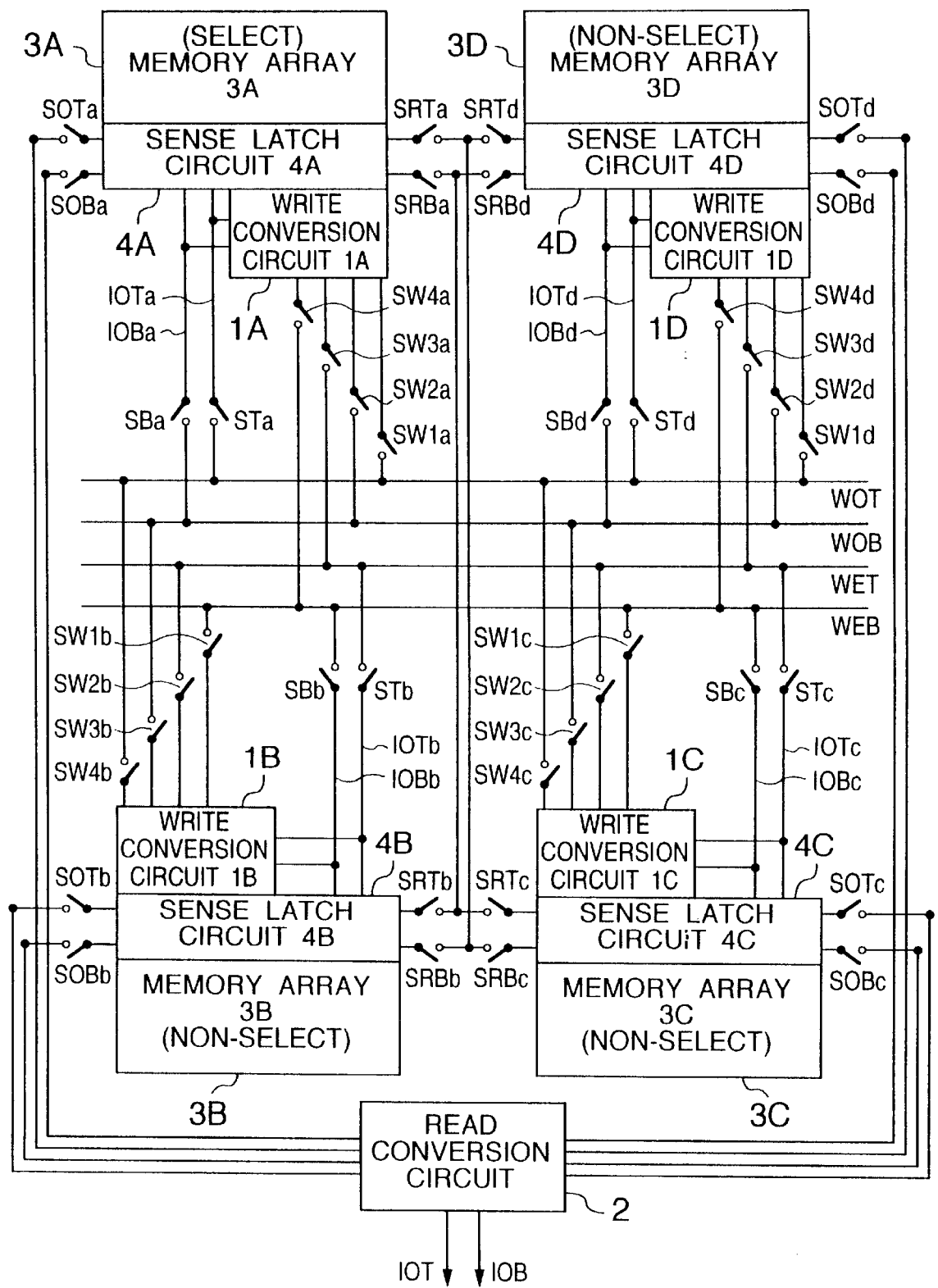
FIG. 14 is a block diagram showing an example of a mode of connection of a memory cell array, a sense latch circuit, a write conversion circuit and a read conversion circuit shown in FIG. 1.

FIG. 14 shows a circuit construction for effecting the four-value write operation by using the complementary data separated into the even-numbered and odd-numbered bits as described above. The construction shown in this drawing corresponds to the memory cell array 3, the sense latch circuit 4, the write conversion circuit 1 and the read conversion circuit 2 that are shown in FIG. 1. The memory cell array 3 comprises four divided memory arrays 3A to 3D, the sense latch circuit comprises four divided sense latch circuits 4A to 4D and the write conversion circuit 1 comprises four divided write conversion circuits 1A to 1D, though these circuit constructions are not particularly limitative. It will be assumed hereby that access is made to one memory array selected from these four memory arrays 3A to 3D. The signal lines of the complementary signals WOT, WOB, WET and WEBN are connected to the write conversion circuit 1A through switches SW1a to SW4a, to the write conversion circuit 1B through switches SW1b to SW4b, to the write conversion circuit 1C through switches SW1c to SW4c, and to the write conversion circuit 1D through switches SW1d to SW4d. The write conversion circuit 1A and the sense latch circuit 4A connected to the input/output lines IOTa and IOBa can be connected to the signal lines of the complementary signals WOT and WOB through the switches SBa and STa and the write conversion circuit 1D and the sense latch circuit 4D connected to the input/output lines IOTd and IOBd can be connected to the signal lines of the complementary signals WOT and WOB through the switches SBd and STd. Similarly, the write conversion circuit 1B and the sense latch circuit 4B connected to the input/output lines IOTb and IOBb can be connected to the signal lines of the complementary signals WET and WEB through the switches SBb and STb, and the write conversion circuit 1C and the sense latch circuit 4C connected t the input/output lines IOTc and IOBc can be connected to the signal lines of the complementary signals WET and WEB through the switches SBc and STc. The sense latch circuits 4A to 4D can mutually exchange the latch signals through the switches SRTa, SRBa, SRTb, SRBb, SRTc, SRBc, SRTd and SRBd. The control circuit 12 controls each of these switches. Each sense latch circuit 4A to 4D can be connected to the read conversion circuit 2 through the switches SOTa, SOBa, SOTb, SOBb, SOTc, SOBc, SOTd and SOBd.

In the circuit shown in FIG. 14, the signals separated into the odd-numbered and even-numbered bits by the separation circuit shown in FIG. 12 are latched and are temporarily held by the sense latch circuit connected to the two non-selected memory arrays in order to write the four-value (one-bit) information into one selected memory array, and the two-value data W1T to W3T corresponding to the "write 1" to "write 3" operations and their complementary signals W1B to W3B are synthesized by using the writ conversion circuit provided to the selected memory array so that the data so synthesized can be latched by the sense latch circuit of the selected memory array and the write operation can be executed.

It will be assumed hereby that the memory cell 3A is the selected memory array (with the other memory arrays 3B to 3D being the non-selected memory arrays), and the write operation is made to the memory cells contained in this selected memory array 3A. The odd-numbered bits WOT and WOB separated by the circuit shown in FIG. 12 are latched by the sense latch circuit 4D by closing the switches STd and SBd, while the even-numbered bits WET and WEB are latched by the sense latch circuit 4B by closing the switches STb and SBb. Though the even-numbered bits may be latched by the sense latch circuit 4C, the explanation will be given hereby the case where they are latched by the sense latch circuit 4B. In each of the "write 1" to "write 3"

operations, the odd-numbered information "WOT" and "WOB" latched by the sense latch circuit 4D and the even-numbered information "WET" and "WEB" latched by the sense latch circuit 4B are transferred to the write conversion circuit 1A of the selected memory array 1A by closing the switches STd, SBd, STb and SBb and the switches SW1a to SW4a. Receiving these information, the write conversion circuit 1A converts the four-value (two-bit) information to the two-value (one-bit) data "0" or "1" ("High" or "Low"), and executes the write and write verify operations by causing the sense latch circuit 4A of the selected memory array 3A to latch them. The circuit construction for synthesizing the data carried out by the write conversion circuits 1A to 1D and an exemplary operation will be explained next.

Figure 15:
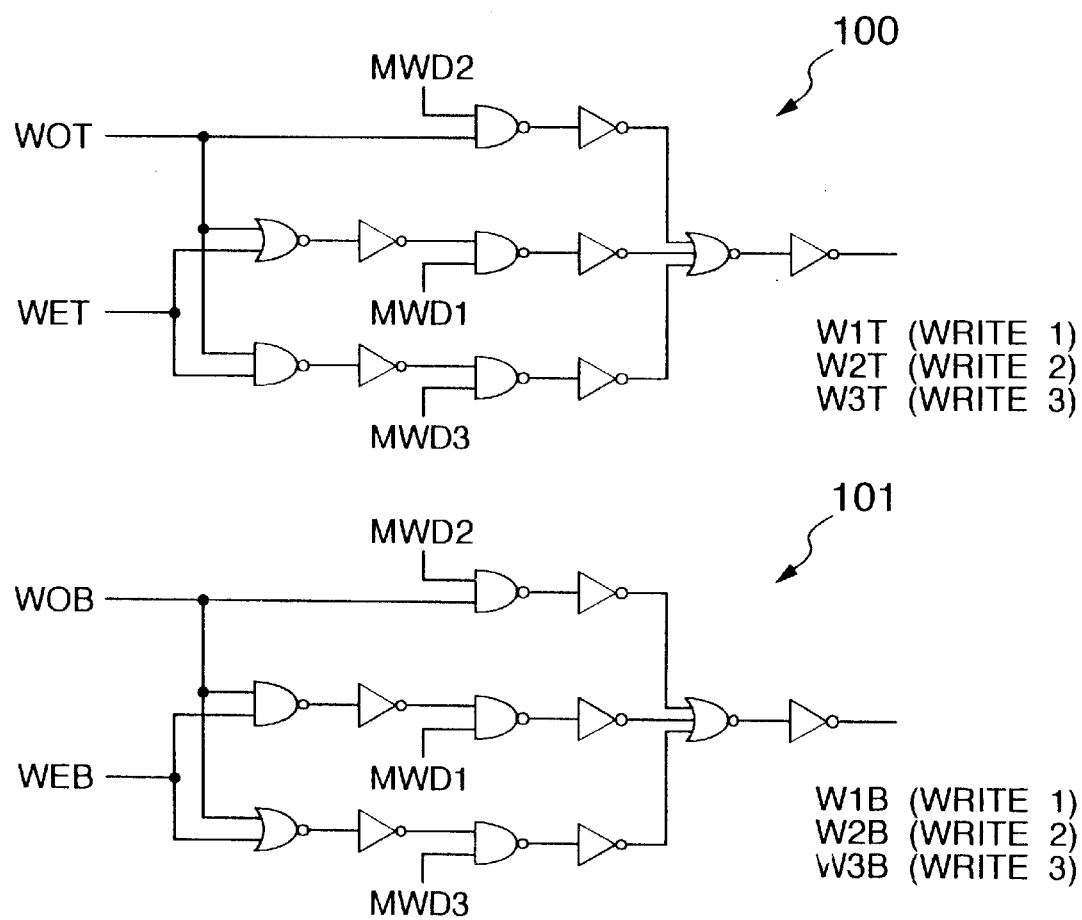
FIG. 15 is a logic circuit diagram showing an example of a write data synthesis circuit for generating data for "write 1" to "write 3" from the data that are separated into the even-number and odd-number by the circuit shown in FIG. 12.

FIG. 15 shows an example of a write data synthesis circuit provided to the write conversion circuit. All the write conversion circuits 1A to 1D shown in FIG. 14 are accomplished by the circuit shown in FIG. 15. The write data synthesis circuit shown in this drawing can be broadly classified into a circuit portion 100 for synthesizing the non-inversion data WOT and WET among the two-bit complementary signals to obtain the data W1T to W3T to be given to the input/output line IOT of the sense latch SL in such a manner as to correspond to "write 1" to "write 3", and a circuit portion 101 for synthesizing the inversion data WOB and WEB among the two-bit complementary signals to obtain the data W1B to W3B to be given to the input/output line IOB of the sense latch SL in such a manner as to correspond to "write 1" to "write 3". The circuit portion 100 generates the data W1T on the basis of the non-inversion data WOT and WET among the two-bit complementary signals through the signal path selected by the mode signal MWD1 at the time of "write 1", generates the data W2T through the signal path selected by the mode signal MWD2 at the time of "write 2", and generates the data W3T through the signal path selected by the mode signal MWD3.

The circuit portion 101 generates the data W1B on the basis of the inversion data WOT and WET through the signal path selected by the mode signal MWD1 at the time of "write 1", generates the data W2B through the signal path selected by the mode signal MWD2 at the time of "write 2", and generates the data W3B through the signal path selected by the mode signal MWD3 at the time of "write 3". In the "write 1", the data W1T and W1B are given to the input/output lines IOT and IOB of the sense latch SL of the selected memory array to thereby conduct the write and write verify operations. In the "write 2", the data W2T and W2B are given to the input/output lines IOT and IOB of the sense latch of the selected memory array to thereby conduct the write and write verify operations.

In the "write 3" operation, the data W3T and W3B are given to the input/output lines IOT and IOB of the sense latch SL of the selected memory array, and the write and write verify operations are carried out. In all of the "write 1" to "write 3" operations, WOT and WET are given from the sense latch circuit 4D on the non-select side while WOB and WEB are given from the sense latch circuit 4C on the non-selected side, to the write conversion circuit 1A on the select side.

FIGS. 16A to 16C show the output results obtained by the data synthesis circuit shown in FIG. 15. When the "write 1" operation is made, the signal MWD1 shown in FIG. 15 is set to "High". Similarly, when the "write 2" and "write 3" operations are carried out, the signals MWD2 and MWD3 are set to "High", respectively. The outputs of IOT and IOB shown in FIGS. 16A to 16C correspond to the write two-value data W1T to W3T shown in FIGS. 7 to 9 with respect to the two-value data strings ("0", "0", "0", "1" , "1", "0","1", "1") to be written from outside, in the "write 1" to "write 3" operation.

Similarly when the data are written to other memory arrays, the data separated into the odd-numbered and even-numbered bits are temporarily latched by the two sense latch circuits of the non-selected memory arrays, the data so latched are transferred to the write conversion circuit of the selected memory at the time of write, and after the write data are synthesized, the data so obtained are latched by the sense latch circuit of the selected memory array.

Incidentally, the circuit for separating the data into the odd-numbered bit and even-numbered bit shown in FIG. 12 and the data synthesis circuit shown in FIG. 15 are included in the write data conversion circuit.

<2> Read Operation

Next, the construction for reading out two-bit information stored in one memory cell will be explained in detail. First, the construction for reading out the two-bit (four-value) data written into one memory cell and converting the data to one-bit (two-value) data string will be explained with reference to FIGS. 17 to 26.

Figure 17:
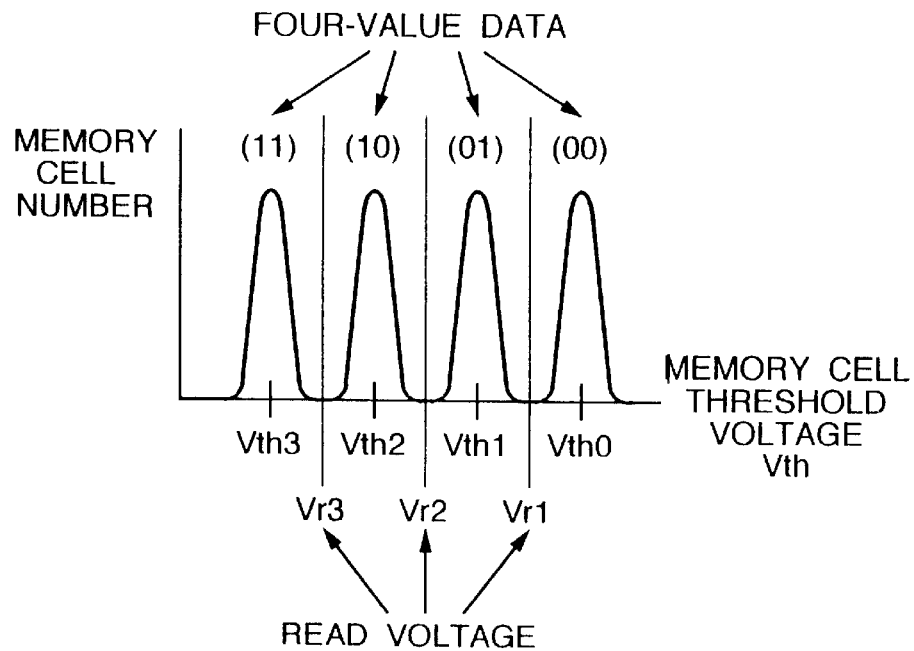
FIG. 17 is an explanatory view showing the relationship between an word line potential and a threshold voltage of the memory cell at the time of readout of the memory cell into which data is written by four values.
Figure 18:
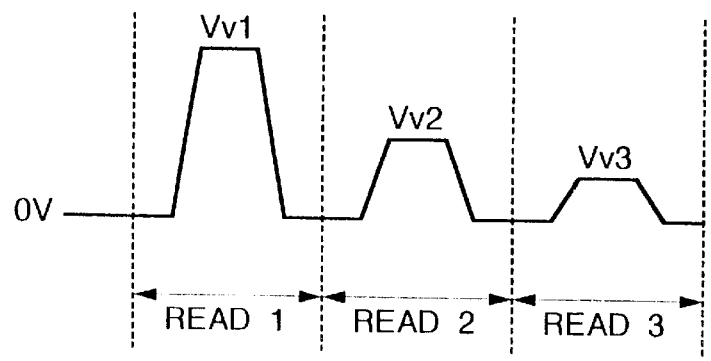
FIG. 18 is a waveform diagram showing an example of the voltage applied to a read word line.

The voltages applied to the word lines at the time of the read operation are, in this embodiment, those voltages which satisfy the relation Vth0>Vr1>Vth1, Vth1>Vr2>Vth2, and Vth2>Vr3>Vth 3, shown in FIG. 17, respectively, for the quadripoled threshold voltages of the memory cell, due to the write operation described in the item <1> as shown in FIG. 17. FIG. 18 shows an example of the voltages applied to the word lines at this time. The read operation by applying the voltage Vr1 to the word line will be hereinafter called "read 1", and similarly, the read operations by applying the voltages Vr2 and Vr3 will be called the "read 2" and "read 3", respectively. These three divided read operations correspond to the very case where the four-value (two-bit) information written into the memory cell are read out as the two-value (one-bit) information for each of the "read 1", "read 2" and "read 3" operations.

Since the operations of the principal circuits including the memory array and the sense latch circuit are in common in the "read 1" to "read 3" operations described above, the read operation for these common portions will be explained first with reference to FIG. 2.

To read out the data, the power source PP on the sense latch SL of the PMOS transistor is set to the ground potential VSS while the power source PN on the NMOS transistor side is set to the power source voltage VCC. Next, the control signal lines RPC and SiD are raised to the select level to turn ON the NMOS switches N4 and N2, respectively. The bit line BL connected to the selected memory cell MC and the node side A are precharged to 1 V, for example, and at the same time, the control signal line RPCa is raised to the select level to turn on the NMOS switch N4a and to precharge the node Aa on the reference side to 0.5 V, for example. Next, the voltages of the control signal lines RPC and RPCa are lowered to the non-select level. After the NMOS switches N4 and N4a are thus turned OFF, the control signal line SiS is raised to the select level, the NMOS switch N3 is turned ON, the source line S and the substrate voltage VWEL of the memory cell are set to 0 V and the read voltage is applied to the word line. At this time, when the threshold voltage of the memory cell MC is lower than the voltage applied to the word line, the memory cell MC is turned ON, a current flows from the bit line BL side to the source line side, and the voltages of the bit line BL and the node A side drop. On the other hand, when the threshold voltage of the memory MC is higher than the voltage applied to the word line, the memory cell MC is not turned ON and the current does not flow through the memory cell MC. Therefore, the voltages of the bit line BL and the node A do not drop. The voltage of the word line WL is set to 0 V, the voltages of the control signal lines SiD and SiS are lowered to the non-select level to turn OFF the NMOS switches N2 and N3, respectively. The control signal lines TR and TRa are raised to the select level, the NMOS switches N6 and N6a are turned ON. Next, the power source PP of the sense latch SL on the PMOS transistor side are set to VCC while the power source on the NMOS transistor side is set to VSS to amplify the voltage difference between the node A and the node Aa on the reference side. The control signal line YG is raised to the select level at the timing at which the amplification operation becomes definite, and the NMOS switches N8 and N8a are turned ON. In this way, the information latched by the sense latch SL is outputted to the input/output lines IOT and IOB. The mutually complementary signals are outputted to the input/output lines IOT and IOB.

Figure 19:
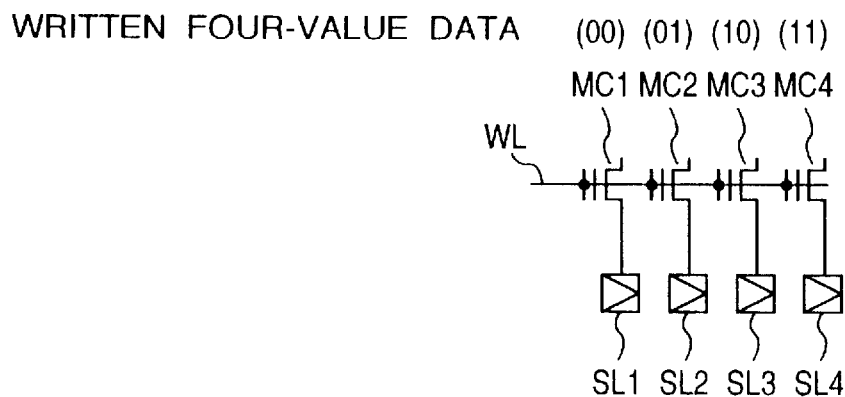
FIG. 19 is an explanatory view showing the correspondence relationship between the four memory cells and the four-value write data written to these memory cells for explaining an example of read of the four-value data.

Next, read of the four-value (two-bit) information written into the memory cells in each of the "read 1" to "read 3" operations will be explained about the case of FIG. 19 by way of example. FIG. 19 illustrates the case where the four-value (two-bit) data of "00", "01", "10" and "11" are written into the four memory cells MC1 to MC4 connected to one word line WL. These four values are stored a "00", "01", "10" and "11" when the two-value (one-bit) data string "00011011" is divided by two and these values are stored in the four memory cells MC1 to MC4 by the write operations described already. Symbols SL1 to SL4 represent the sense latches connected to the respective memory cells MC1 to MC4. This embodiment makes it possible to read out multiple values (four values) stored in one memory cell by a simple sense latch construction.

Figure 20:
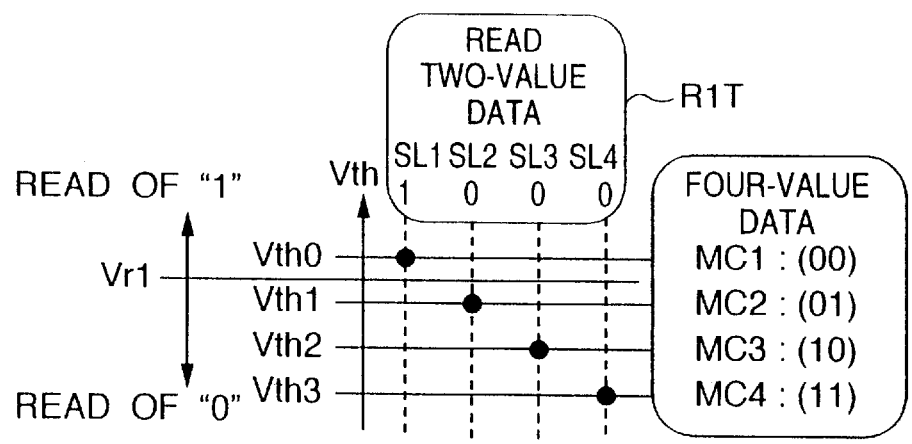
FIG. 20 is an explanatory view showing two-value data obtained by "read 1" for the memory cell shown in FIG. 19.
Figure 21:
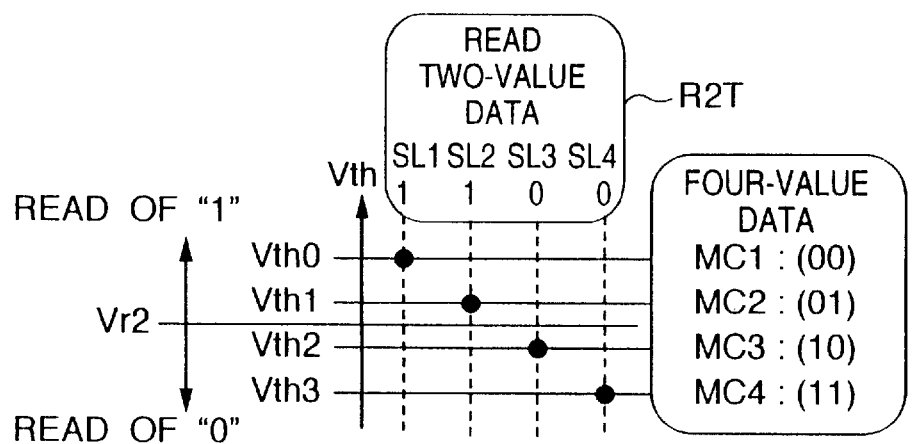
FIG. 21 is an explanatory view showing the two-value data obtained by "read 2" for the memory cell shown in FIG. 19.
Figure 22:
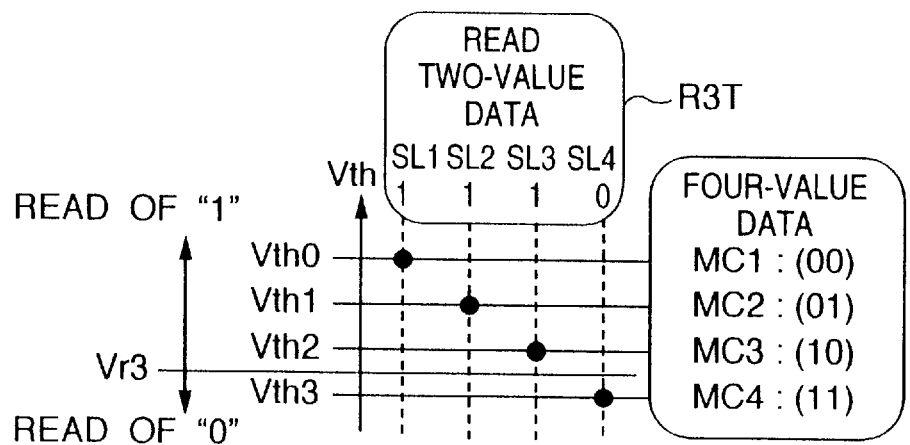
FIG. 22 is an explanatory view showing the two-value data obtained by "read 3" for the memory cell shown in FIG. 13.

FIG. 20 shows the relation between the threshold voltages of the memory cells MC1 to MC4 and the read voltage Vr1 applied to the word line and "0" or "1" ("High" or "Low") of the two-value (one-bit) data R1T read out from the memory cells MC1 to MC4 and latched by the sense latches SL1 to SL4 by the "read 1" operation. Similarly, FIGS. 21 and 22 show the relation between the threshold voltages of the memory cells MC1 to MC4 and the read voltages Vr2 and Vr3, respectively, and the data R2T and R3T read out from the memory cells MC1 to MC4 and latched by the sense latches SL1 to SL4 by each of the "read 2" and "read 3" operations. As to the flash memory having the construction shown in FIG. 14, means for converting the two-value (one-bit) data R1T to R3T read out from the memory cells in which the two-value (one-bit) information are compressed and the four-value (two-bit) information are stored, and their complementary signals R1B to R3B before they are compressed and stored as the four-value data in the memory cells, will be explained.

The explanation will be given on the case where the information of the selected memory array 3A shown in FIG. 14 are read out, by way of example. The two-value (one-bit) data R1T read out by the "read 1" operation and its complementary signal R1B are transferred from the sense latch circuit 4A to the sense latch circuit 4B by closing the switches SRTa, SRBa, SRTb and SRBb and consequently, the sense latch 3B latches the data R1T and R1B. After these switches SRTa, SRBa, SRTb and SRBb are opened, the "read 2" operation is carried out. In this "read 2" operation, as the switches SRTa, SRBa, SRTc and SRBc are closed, the two-value (one-bit) data R2T and R2B read out from the selected memory array 3A are transferred from the sense latch circuit 4A to the sense latch 4C, so that the sense latch circuit 4C latches the data R2T and R2B. Thereafter, after these switches are opened, the "read 3" operation is started, and the two-value (one-bit) data R3T and R3B are read out and are latched by the sense latch 4A. The three read data latched by the three sense latch circuits 4A, 4B and 4C are given to the read conversion circuit 2 through the switches SOTa, SOBa, SOTb, SOBb,SOTc and SOBc. The read conversion circuit 2 converts or restores the data to a one-bit data string.

Figure 23:
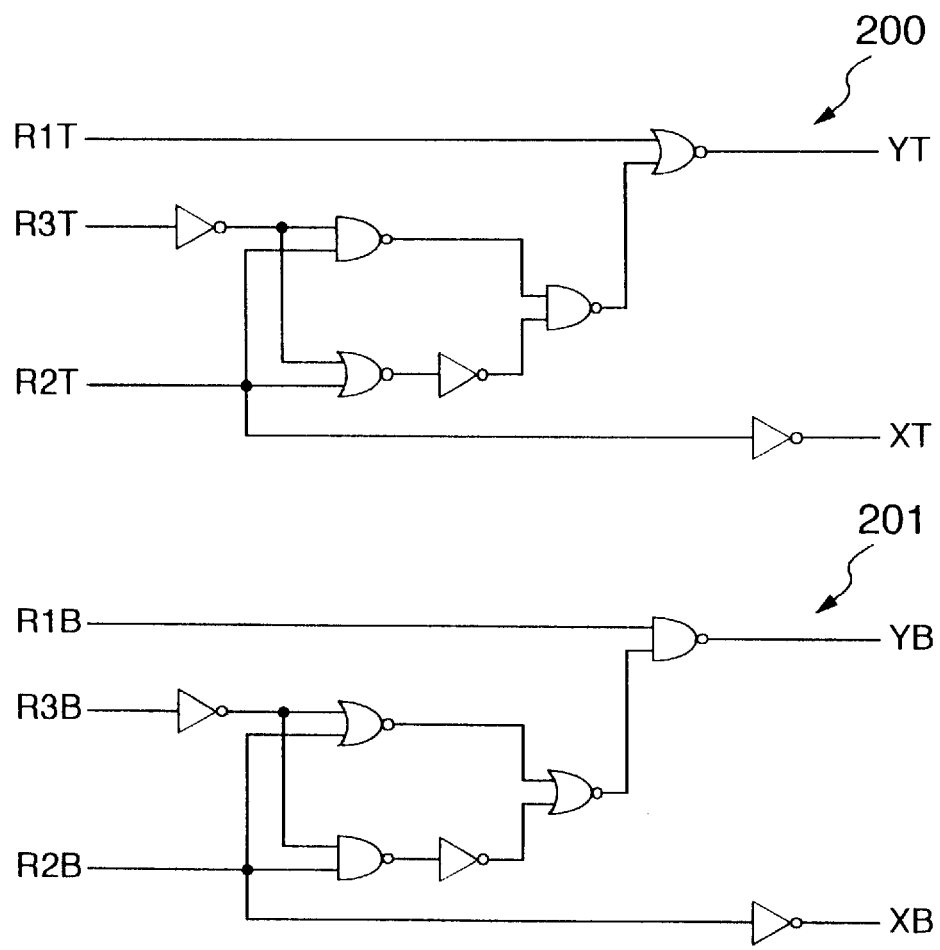
FIG. 23 is a logic circuit diagram showing an example of a read data synthesis circuit.

FIG. 23 shows an example of the circuit for converting the two-value (one-bit) data R1T to R3T read out by the "read 1" to "read 3" operations and their complementary signals R1B to R3B to the four-value (two-bit) data "00", "01", "10" and "11".

The read data synthesis circuit shown in this drawing is broadly classified into a circuit portion 200 on the input/output line IOT side and a circuit portion 201 on the input/output line IOB side. The circuit portion 200 generates in parallel two-bit complementary signals YT and XT on the basis of the complementary signals R1T to R3T obtained by the three read operations "read 1" to "read 3". The circuit portion 201 generates in parallel the two-bit complementary signals YB and XB on the basis of the complementary signals R1B to R3B obtained by the three read operations "read 1" to "read 3". In other words, this read data synthesis circuit converts the data R1T, R2T and R3T transferred from the sense latch circuits 4A, 4B and 4C and their complementary signals R1B, R2B and R3B to the four-value (two-bit) data string. Symbol XT represents the high order bit of the four-value (two-bit) data and symbol YT represents the low order bit. Symbols XB and YB represent their complementary signals. When the four-value data is "10", for example, the high order bit is "1" and the low order bit is "0".

FIG. 24 shows the relation between the data R1T to R3T (R1B to R3B) obtained by the "read 1" to "read 3" operations and the resulting synthesis outputs XT and YT (XB, YB).

Figure 25:
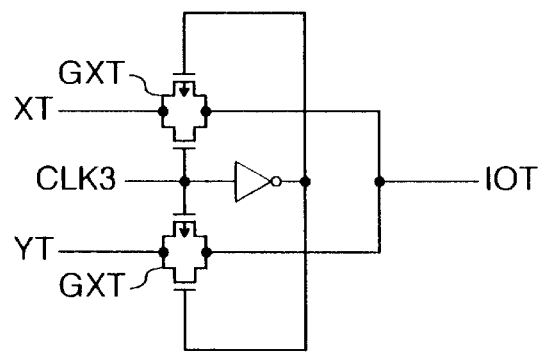
FIG. 25 is a circuit diagram showing an example of the circuit for alternately outputting high order bits and low order bits on the basis of the output of the read data synthesis circuit.
Figure 25:
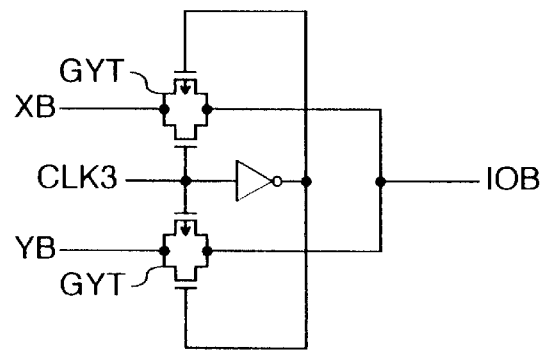

XT and XB of the high order bit and YT and YB of the low order bit obtained by the read data synthesis circuit described above are alternately selected by the circuit shown in FIG. 25 and are outputted. The circuit shown in FIG. 25 comprises CMOS transfer gates, GXB, GYT, and GYB and for alternately outputting the high order bit XT and the low order bit YT to IOT and the complementary signal XB of the high order bit and the complementary signal YB of the low order bit to IOB in synchronism with the clock signal CLK3. In this way, the four-value information stored in one memory cell can be read out as the two-bit data string.

Figure 26:
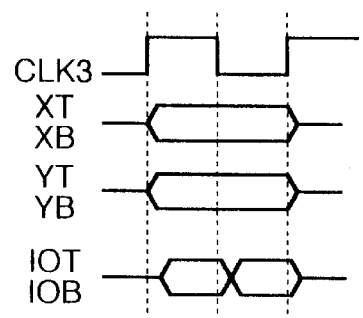
FIG. 26 is a timing chart showing an example of the operation of the circuit shown in FIG. 25.

FIG. 26 shows the outputs of IOT and IOB when "XT" and "YT" are "11" (with the complementary signals "XB" and "YB" being "00"), that is, when the information stored in one memory cell is "11" as the four-value (two-bit) information, as an exemplary operation timing of the circuit shown in FIG. 26. When the clock signal CLK3 is "High", the CMOS transfer gates GXT and GXB are opened and the signals XT and XB are outputted to the input/output lines IOT and IOB, respectively. At this time, the CMOS transfer gates GYT and GYB are closed, and the signals YT and YB are not outputted. When the clock signals CLK3 is "Low", on the other hand, the CMOS transfer gates GYT, GYB are opened, the signals YT and YB are outputted to the input/output lines IOT and IOB, and the signals XT and XB are not outputted because the transfer gates GXT and GXB are closed.

Incidentally, the read data synthesis circuit shown in FIG. 23 and the alternate output circuit of the high and low order bits shown in FIG. 25 are included in the read conversion circuit 2.

The feature of the read operation explained above resides in that the two-value (one-bit) data read out by the three read operations, i.e. "read 1" to "read 3", in such a manner as to correspond to the four-value (two-bit) information written into the memory cell, are transferred to the sense latch circuit of the non-selected memory cell, and after the read operations of the three times are completed, these two-value (one-bit) data are converted by the read data conversion circuit to the two-value (one-bit) data string so as to read out the four-value (two-bit) information.

Figure 27:
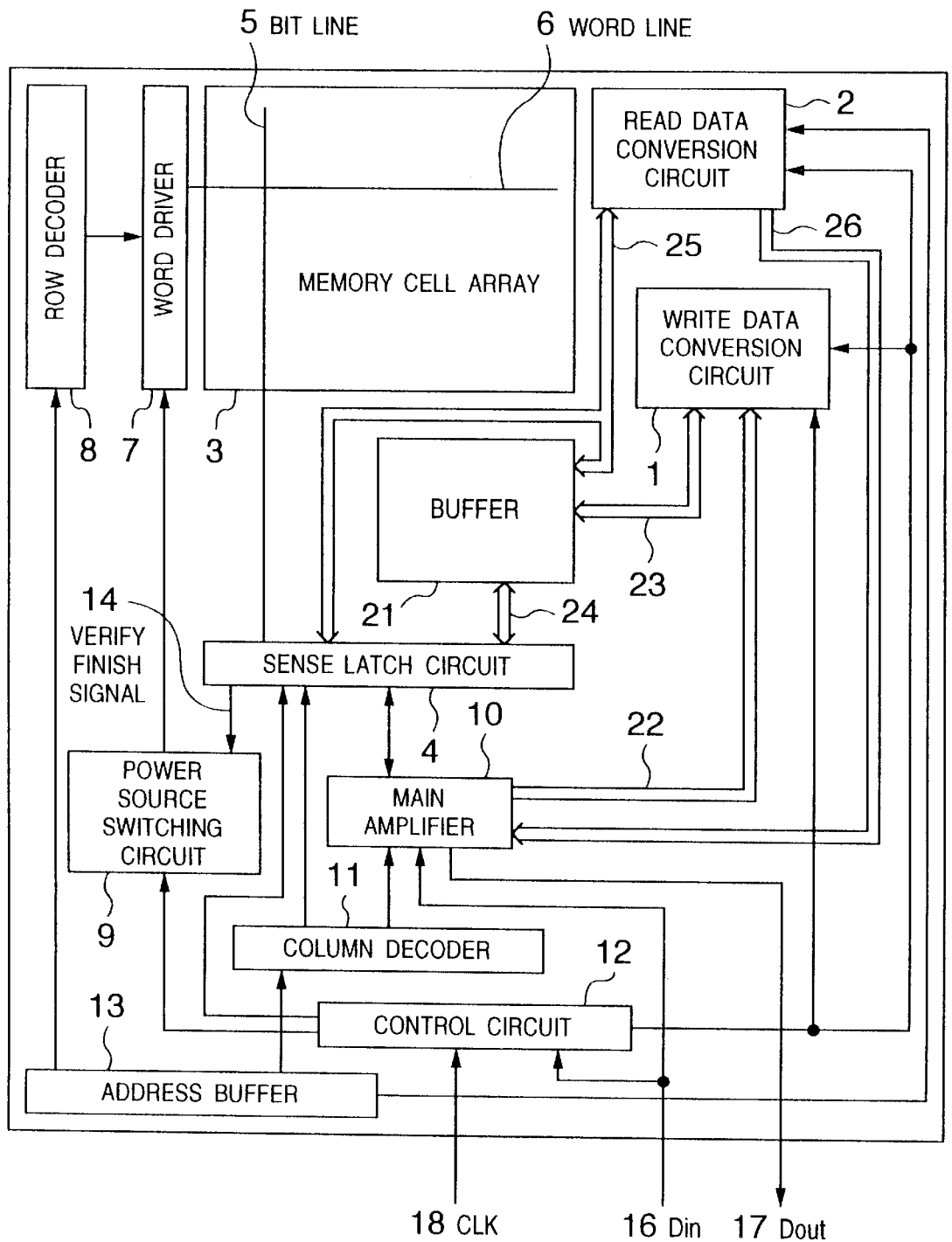
FIG. 27 is a block diagram of a flash memory equipped with a buffer for temporarily storing write data and read data according to the second embodiment of the present invention.

FIG. 27 shows another example of the flash memory. The flash memory explained with reference to FIG. 1 temporarily latches the data to be written into the non-selected sense latch circuit or the data read out from the memory cell at the time of write or read, and converts them to the data to be written into the memory cell or the data to be read out to the outside. In the flash memory shown in FIG. 27, on the other hand, a buffer 21 for exclusively governing the function of the sense latch on the non-selected memory side is disposed inside the clip of the flash memory, and the data are temporarily latched by this buffer 21. The operations at the time of write and read and the method of converting the data are the same as those which have been explained about the flash memory shown in FIG. 1, but the difference lies in that the buffer 21, but not the non-selected sense latch circuit, is used to latch the data.

In this case, the write and read operations of the four-value (two-bit) data are executed in the following way. The two-value data separated into the odd-numbered and even-numbered bits by the write data conversion circuit 1 in the same way as described above are transferred to, and latched by, the buffer 21 through a signal line 23. To synthesize the two-value (one-bit) data corresponding to the "raed 1" to "read 3" operations, the data separated into the odd-numbered and even-numbered bits are transferred from the buffer 21 to the write data conversion circuit 1 through the signal line 23. Three kinds of write data synthesized by this write data conversion circuit 1 are again transferred to, and latched by, the buffer 21 through the signal line 23. The data so synthesized is transferred to the sense latch circuit 4 through a signal line 24 in each of the "write 1" to "write 3" operations and is latched by the same, so as to execute the write and write verify operations. In the read operation, on the other hand, the two-value (one-bit) data read out by each of the "raed 1" to "read 3" operations is transferred to, and latched by, the buffer 21 from the sense latch circuit 4 though the signal line 24. These two-value data are transferred to the read data conversion circuit 2 through a signal line 25, and are converted to a two-value (one-bit) data string in the same way as in the embodiment described above, are then amplified by the main amplifier 10, and are outputted from Dout 17. The control circuit 12 controls these operations.

Figure 28:
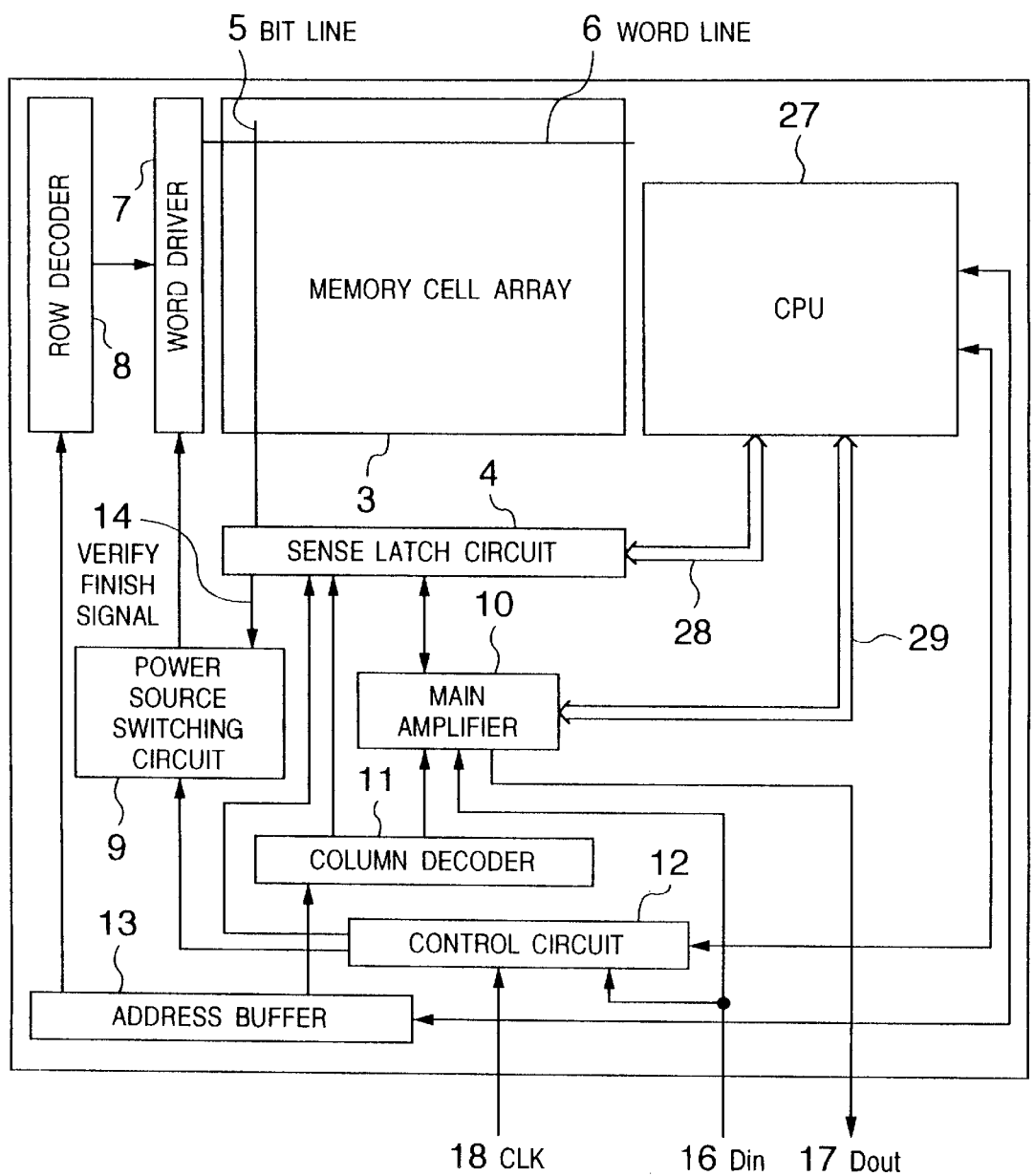
FIG. 28 is a block diagram of a flash memory equipped with a CPU according to the third embodiment of the present invention.

FIG. 28 shows another example of the flash memory. This flash memory includes a built-in central processor (CPU) 27. This central processing mechanism 27 means a circuit block corresponding to a central processing unit or a micro-processing unit. This central processing mechanism 27 achieves the functions of write data conversion, read data conversion and control of the data transfer between the sense latch circuits at these times as have been explained with reference to the flash memory shown in FIG. 1. It is to be understood that the operation program of the central processing mechanism 27 for achieving these functions is stored in the built-in semiconductor memory device or in another on-chip semiconductor memory device not shown in the drawings.

Figure 29:
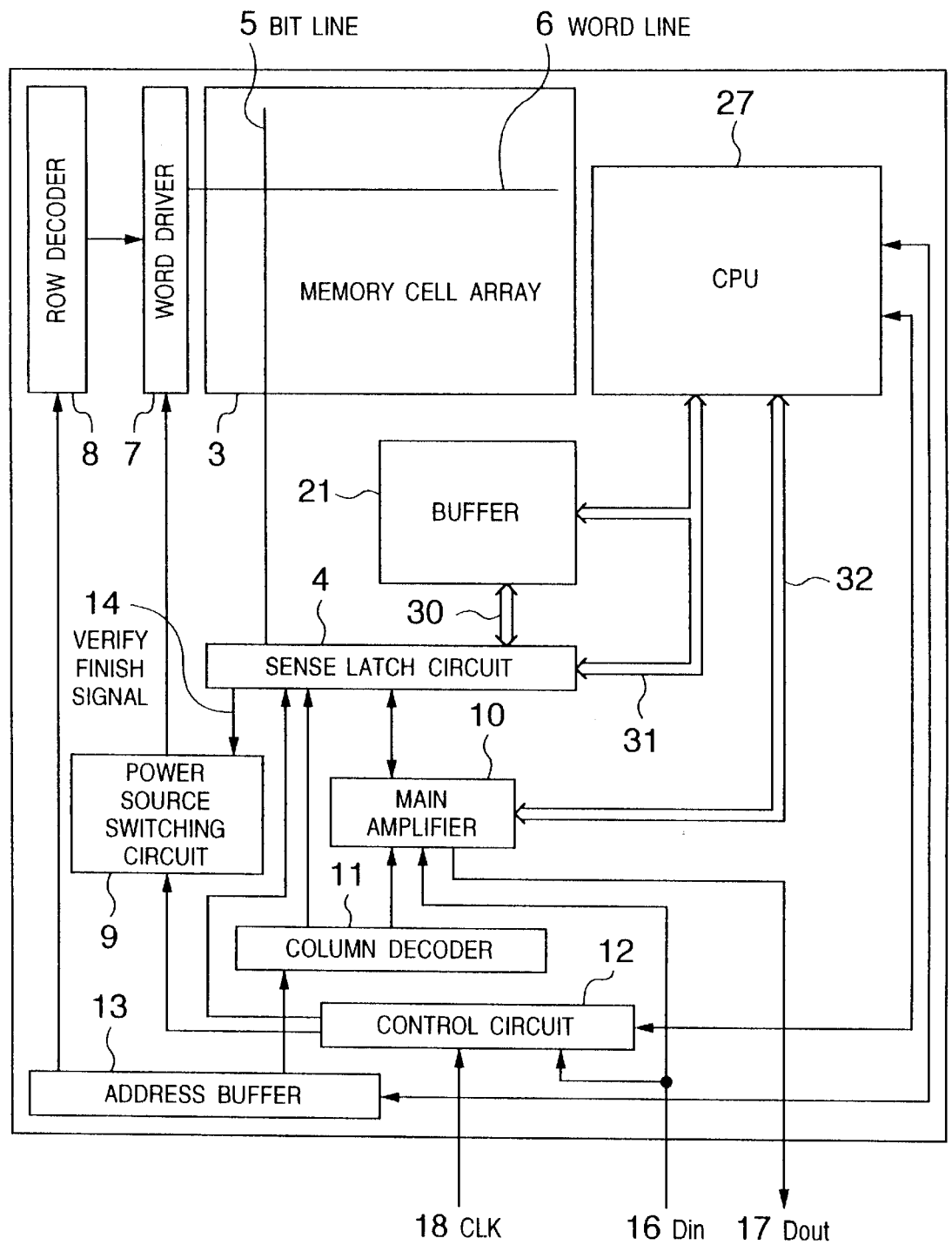
FIG. 29 is a block diagram of a flash memory equipped with a buffer for temporarily storing write data and read data and with a CPU according to the fourth embodiment of the present invention.

The flash memory shown in FIG. 29 includes both of the buffer 21 and the central processing mechanism 27 on the same semiconductor chip.

Each of the flash memories shown in FIGS. 28 and 29 includes the central processing mechanism 27 on the chip thereof, can execute the operations such as various data conversions at the time of read and write of the four-value (two-bit) by the central processing mechanism 27, and can execute the write and read operations of four-value (two-bit) by using the non-selected sense latch circuit or the buffer 21 disposed on the chip. The four-value (two-bit) write and read operations in the flash memory shown in FIG. 28 are in common with those of the flash memory shown in FIG. 1 in that they use the sense latch circuit of the non-selected memory array. The flash memory shown in FIG. 29 is similar to the flash memory shown in FIG. 27 in that they use the buffer 21. As to the data conversion, each of the flash memories shown in FIGS. 1 and 27 is equipped with the write conversion circuit for the memory array and for the sense latch circuit each controlled independently, whereas in the flash memories shown in FIGS. 28 and 29, the read data conversion function and the write data conversion function are accomplished by the central processing mechanism 27.

The four-value (two-bit) write and read operations in the flash memory shown in FIG. 28 are executed in the following way. When the two-value (one-bit) data string to be written is inputted from Din 16, it is amplified by the main amplifier 10, is transferred to the central processing mechanism 27 through the signal line 29, and is separated into odd-numbered and even-numbered bits. The two-value (one-bit) data so separated into the odd-numbered and even-numbered bits are transferred to, and latched by, the sense latch (non-selected sense latch) connected to the non-selected memory cell of the sense latch circuit 4 through the signal line 28. To synthesize the two-value (one-bit) data corresponding to "write 1" to "write 3" by the central processing mechanism 27, the data separated into these odd-numbered and even-numbered bits are transferred from the sense latch circuit 4 to the central processing mechanism 27 through the signal line 28. The data converted by the central processing mechanism 27 are transferred to, and latched by, the sense latch circuit 4 through the signal line 28 in accordance with each of the "write 1" to "write 3" operations, and are utilized for the write and write verify operations. On the other hand, the two-value (one-bit) data read out by the "read 1" to "read 3" operations are latched by the non-selected sense latch of the sense latch circuit 4 during the read operation. The two-value (one-bit) data read out by the read operations carried out thrice and latched by the sense latch circuit are transferred to the central processing mechanism 27 through the signal line 28, are converted to the two-value (one-bit) data string in the same way as in the flash memory shown in FIG. 1, are transferred to, and amplified by, the main amplifier 10 through the signal line 29, and are outputted to the outside from Dout 17.

The flash memory shown in FIG. 29 executes the four-value (two-bit) write and read operations in the following way. When the tow-value (one-bit) data string to be written is inputted from Din 16, the data are amplified by the main amplifier 10, are transferred to the central processing mechanism 27 through the signal line 29 and are separated into the odd-numbered and even-numbered bits. The two-value (one-bit) data so separated into the odd-numbered and even-numbered bits are transferred to, and latched by, the buffer 21 through the signal 31. To synthesize the two-value (one-bit) data corresponding to the "write 1" to "write 3" operations by the central processing mechanism 27, the data separated into these odd-numbered and even-numbered bits are transferred from the buffer 21 to the central processing mechanism 27 through the signal line 31. The data converted by the central processing mechanism 27 are transferred to, and latched by, the sense latch circuit 4 through the signal line 31 in accordance with each of the "write 1" to "write 3" operations, and are utilized serially for the write and write verify operations. In the read operation, on the other hand, the two-value (one-bit) data read out from the memory cell by each of the "read 1" to "read 3" operations are transferred to, and latched by, the buffer 21 from the sense latch circuit 4 through the signal line 30. The two-value (one-bit) data read out by the read operations executed thrice and latched by the buffer 21 are transferred to the central processing mechanism 27 through the signal line 31, are converted to the two-value (one-bit) data string in the same way as in the flash memory shown in FIG. 1, are then transferred to, and amplified by, the main amplifier 10 through the signal line 29, and are outputted to the outside from Dout 17. Incidentally, the flash memory equipped with the on-chip central processing mechanism 27 can accomplish the functions of the control circuit 12 by its central processing mechanism 27.

Figure 30:
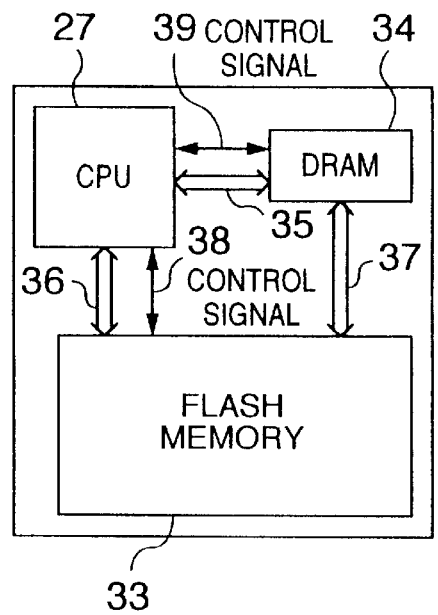
FIG. 30 is a block diagram of a flash memory having a DRAM as a buffer and a CPU as a multiple-chip according to the fifth embodiment of the present invention.

FIG. 30 shows an example of the case where the single chip shown in FIGS. 28 and 29 is accomplished y multiple chips. In other words, this example comprises the flash memory 33, the central processing mechanism 27 and a DRAM (Dynamic Random Access Memory) in the multichip configuration. In comparison with the flash memory shown in FIG. 28, this flash memory 33 does not have a built-in central processing mechanism, and in comparison with the flash memory shown in FIG. 2, it does not include the write conversion circuit and the read conversion circuit. When the data is converted at the time of the read and write operations, the data is transferred to, and temporarily latched, by the DRAM 34, and the central processing mechanism 27 executes this data conversion, and writes the four-value data to one memory cell or reads the four-value data stored in one memory cell. In FIG. 30, reference numerals 38 and 39 denote control signals, and reference numerals 35, 36 and 37 denote signal lines for the address and the data.

Figure 31:
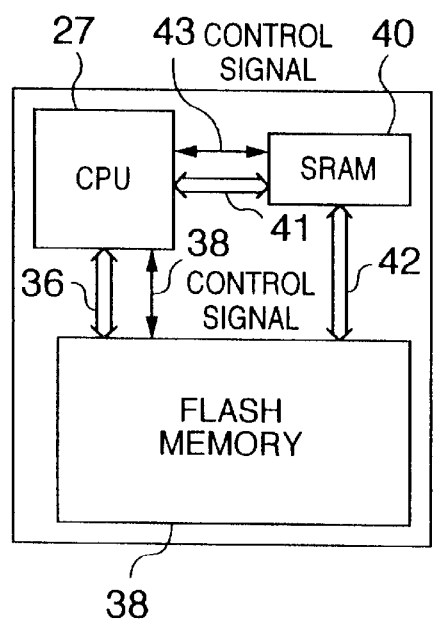
FIG. 31 is a block diagram of a flash memory having an SRAM as a buffer and a CPU as a multiple-chip according to the sixth embodiment of the present invention.

The circuit shown in FIG. 31 is different in that the DRAM 34 contained in the circuit construction shown in FIG. 30 is changed to an SRAM (Static Random Access Memory) 40. In this circuit construction, the data are transferred to, and temporarily latched, by the SRAM 40 at the time of the data conversion, the central processing mechanism 27 executes the conversion of the data latched by the SRAM 40 and the read or write operation. In FIG. 31, reference numerals 38 and 43 denote the control signals and reference numerals 36, 41 and 42 denote the signal lines for the address and the data.

Figure 32:
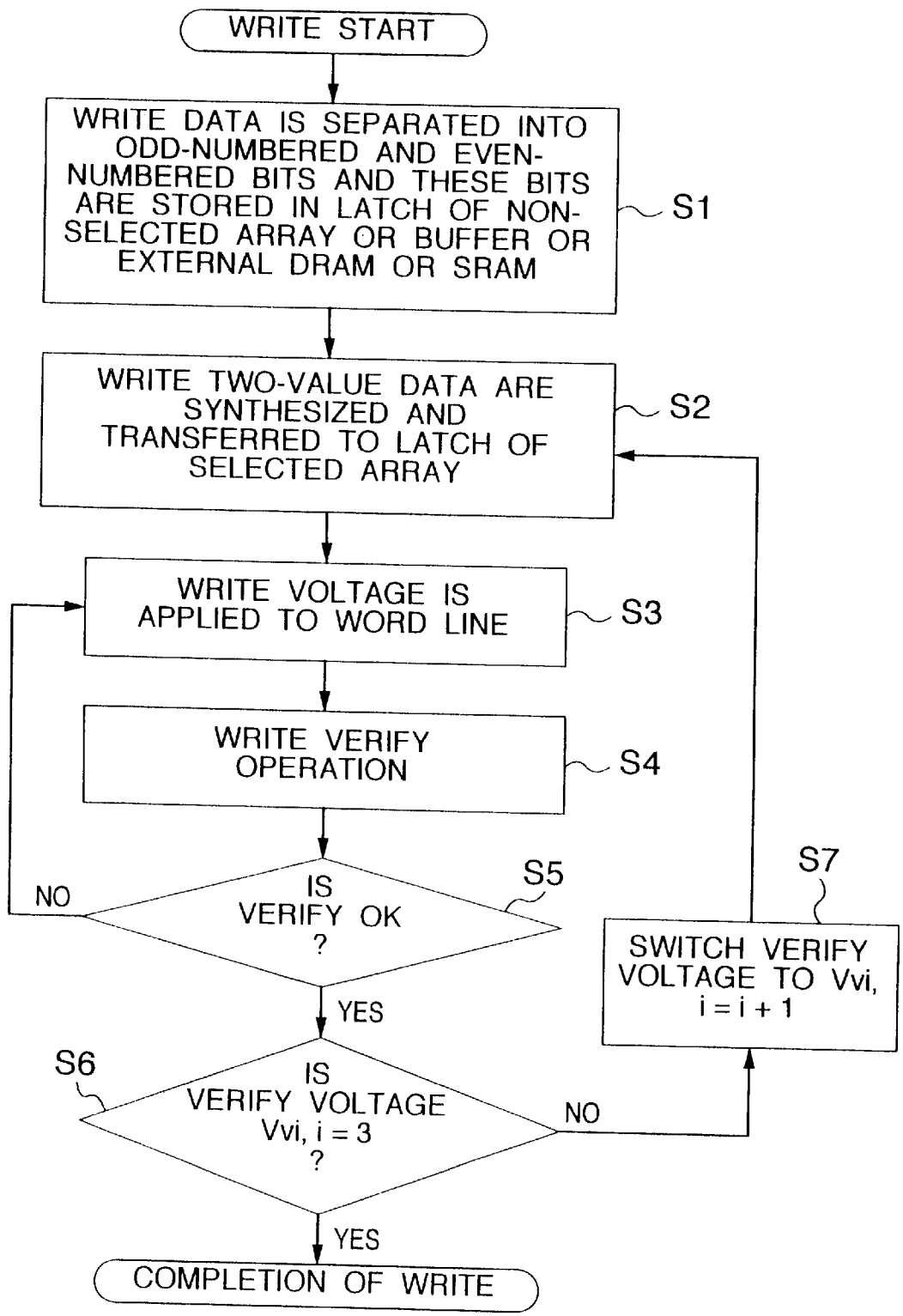
FIG. 32 is a flowchart showing an example of a write operation for writing four-value information into memory cells.
Figure 33:
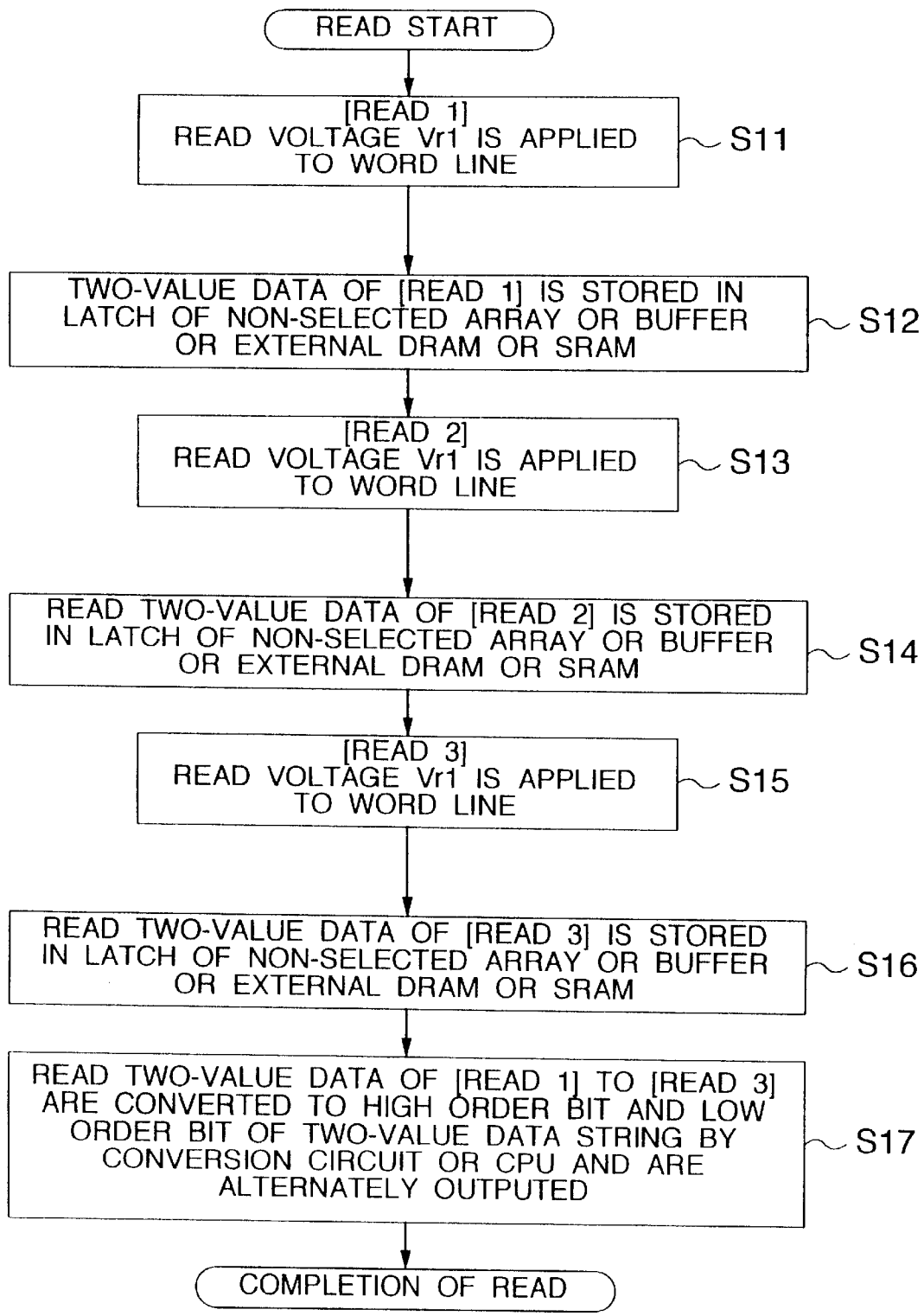
FIG. 33 is a flowchart showing an example of the read operation to the memory cell into which four-value information is written.

FIGS. 32 and 33 show an example of the procedure of the four-value (two-bit) write and read operations in various flash memories that have been explained above. In other words, when the write operation is executed, the write data are separated into the odd-numbered and even-numbered bits, and are temporarily stored in the sense latch of the non-selected memory array or the buffer 21 or the external DRAM 34 or SRAM 40 (S1). Next, the write two-value data to be practically written into the memory cell are serially synthesized from the data stored temporarily in accordance with each of the "write 1" to "write 3" operations, and are transferred to the sense latch of the selected memory array (S2). The write voltage is applied to the word line, and the write operation of the memory cell is executed in accordance with the data latched by the sense latch (S3). The write verify operation is made for the memory cell to which the write operation is made (S4), and the operations of Steps S3 and S4 are repeated until the required threshold voltage can be obtained by the write operation (S5). Whether or not the write operation is made up to "write 3" is then judged (S6). If the write operation is not completed up to "write 3", the write verify voltage is set to the next verify voltage (S7) and the Steps S1 to S7 are repeated until "write 3" is completed.

In the read operation, the read voltage Vr1 is first applied to the word line of the memory cell as the access object and the "read 1" operation is executed (S11). The two-value data thus read out are transferred to the sense latch corresponding to the non-selected memory array, the buffer 21 or the DRAM 34 or the SRAM 40 (S12). Next, the read voltage Vr2 is applied to the word line, and the "read 2" operation is carried out (S13), so that the two-value data so read out are transferred to the sense latch corresponding to the non-selected memory array, the buffer 21 or the DRAM 34 or the SRAM 40 (S14). Further, the "read 3" operation is carried out by applying the read voltage Vr3 to the word line (S15), so that the two-value data so read out are transferred to the sense latch corresponding to the non-selected memory array or the buffer 21 or the DRAM 34 or the SRAM 40 (S16). The two-value data obtained in this way by the "read 1" to "read 3" operations are converted by the central processing mechanism 27 into the high order bit and the low order bit of the two-value data string, and are alternately outputted to the outside (S17).

Figure 34:
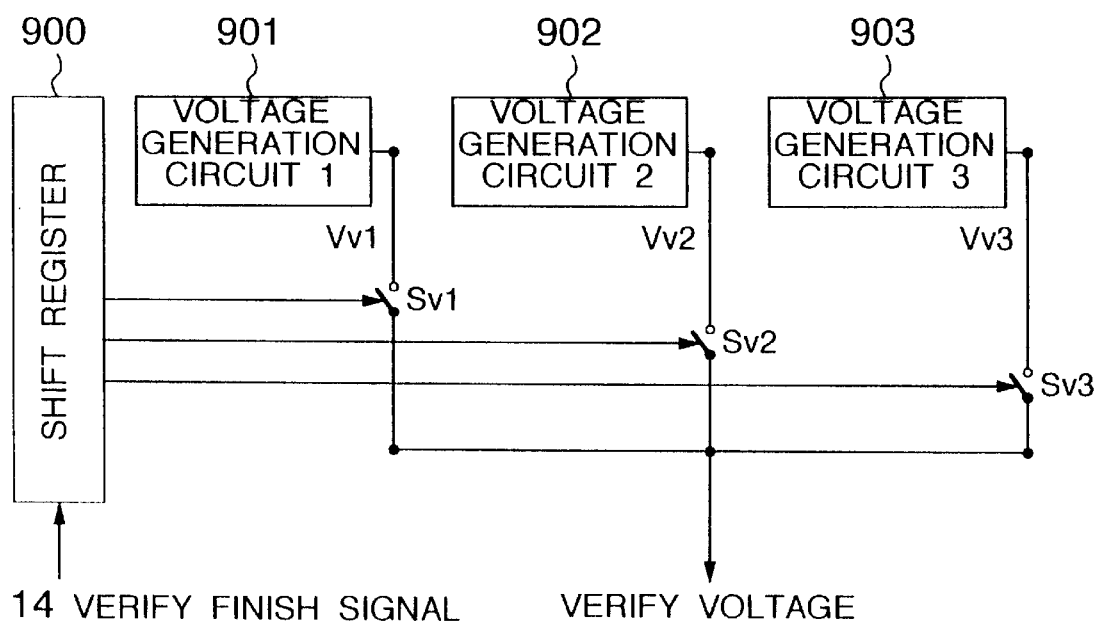
FIG. 34 is a block diagram showing an example of a structure for switching three kinds of verify voltages.
Figure 35:
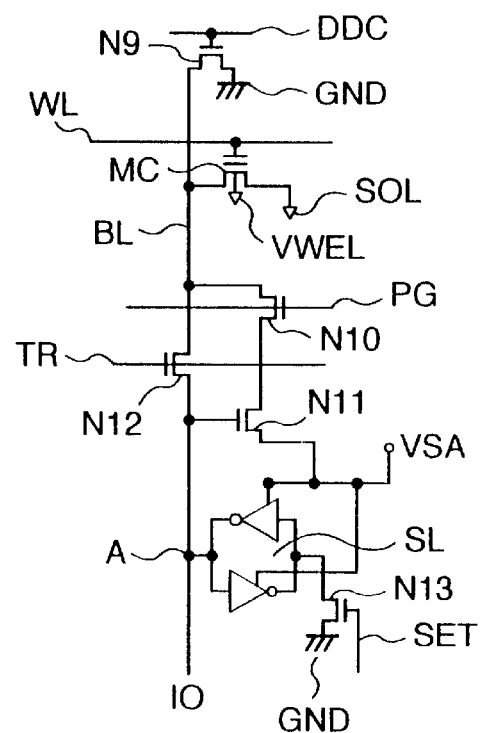
FIG. 35 is a circuit diagram showing an example of a partial structure of a flash memory in which one memory cell stores two-value information.
Figure 36:
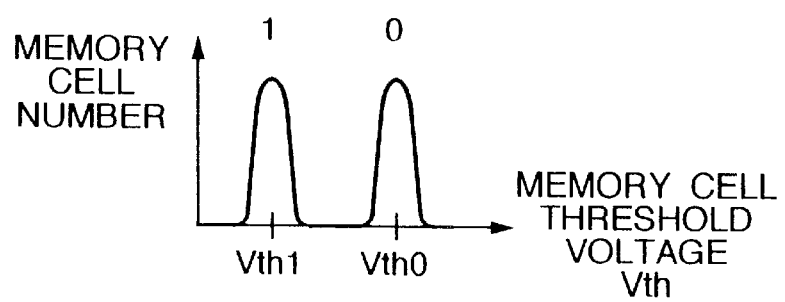
FIG. 36 is an explanatory view showing an example of a threshold voltage distribution of the memory cell into which two-value information is written.

FIG. 34 shows an structural example of the circuit for changing over the write verify voltages Vv1, Vv2 and Vv3 at the time of the write operation. This circuit is included in the power source switching circuit 9 shown in FIG. 1 and FIGS. 27 to 29. The verify finish signal 14 shown in FIG. 1 and FIGS. 27 to 29 is outputted from the sense latch circuit 4. In other words, the signal from the input/output line IOT in the write verify operation is the verify finish signal 14. This verify finish signal 14 is activated at a predetermined timing when the write state reaches a predetermined threshold voltage in the write verify operation of each of the "write 1" to "write 3" operations, that is, when the individual write operation in each of the "write 1" to "write 3" is completed. The verify finish signal 14 is supplied as the shift clock to the shift register 900, and whenever each of the "write 1" to "write 3" operation is completed, the carry latched by the initial stage memory circuit is serially shifted to the memory circuit of the post state. The switching operations of the switches Sv1 to Sv3 is controlled by the latch signal of each memory circuit. The switch Sv1 is turned ON at the initial stage, and the switches which are turned ON become serially different in accordance with the sequence of the transfer of the carry. The write verify voltages Vv1 to Vv3 are generated by voltage generation circuit s 901 to 903, and the switches Sv1 to Sv3 select the verify voltages Vv1 to Vv3 generated by these voltage generation circuits 901 to 903 and apply them to the word driver 7.

As described above, the verify finish signal 14 is inputted to the shift register 900 and the verify voltage is changed over. To apply the write verify voltage Vv1 in the "write 1" operation to the word line, the switch Sv1 is turned ON. When the verify finish signal of "write 1" is applied to the shift register 900, the switch Sv1 is turned OFF but the switch Sv2 is turned ON, so that the write verify voltage Vv2 of "write 2" is applied as the verify voltage to the word line. Similarly, when verify of "write 2" is completed, the switch Sv2 is turned OFF but the switch Sv3 is turned ON, so that Vv3 is applied as the verify voltage to the word line. When the verify finish end signal of "write 3" is inputted to the shift register, the shift register is reset and the switch Sv3 is turned OFF, too, and all the write operations are completed.

As explained above, the present invention applies three different kinds of voltages to the word line at the time of the verify operation, controls the threshold voltage of the memory cel, and synthesizes the two-value (one-bit) write data corresponding to the four-value (two-bit) information to be written in each of the three write operations by using the sense latch circuit connected to the non-selected memory array or the buffer disposed inside the chip, or the external DRAM or SRAM. Therefore, the present invention can write the four-value (one-bit) information into one memory cell and ca double the memory capacity of the flash memory. To read out the four-value (one-bit) information stored in this way and to obtain the two-value (one-bit) information, on the other hand, three different kinds of voltages are applied to the word line at the time of the read operation, the two-value (one-bit) information read out in each of these read operations is temporarily stored in the sense latch circuit connected to the non-selected memory array or the buffer disposed inside the chip or the external DRAM or SRAM, and three kinds of two-value (one-bit) information are then synthesized, and are converted to the two-value (one-bit) information corresponding to the four-value (two-bit) information stored in the memory cell.

Though the invention completed by the present inventor has thus been explained concretely with reference to some preferred embodiments thereof, the present invention is not particularly limited thereto, but can be changed or modified naturally in various ways without departing from the scope thereof. For example, the flash memory shown in FIG. 1, etc. is single memory LSI but it can be constituted into an on-chip memory of a logic LSI such as a micro-computer. The memory cell of the multi-chip construction shown in FIGS. 30 and 31 can be constituted into a single chip and in such a case, the circuit construction shown in FIGS. 30 and 31 can be located as one of the functions of the data processing LSI such as a micro-computer. In such a case, the central processing mechanism 27 can be regarded as the circuit versatilely utilized for other data processings. The non-volatile semiconductor memory device of the present invention is not particularly limited to the flash memory having one-transistor type memory cells but can be applied to an EEPROM the memory cells of which comprise memory transistors and select transistors.

The effects brought forth by the typical inventions among those disclosed in this application are briefly as follows.

In the verify operation, the write operations are carried out serially three times by applying three different kinds of voltages to the word line to control the threshold voltage of the memory cell. The two-value (one-bit) write data corresponding to the four-value (two-bit) information to be written are synthesized by the sense latch circuit connected to the non-selected array or the buffer disposed inside the chip or the external DRAM or SRAM, for example, in the write data conversion circuit for each write operation, and in this way, the four-value (two-bit) information can be written into one memory cell, and the memory capacity of the flash memory can be doubled.

To read out the four-value (two-bit) information so stored and to convert them to the two-value (one-bit) information, three different kinds of voltages are serially applied to the word line at the time of the read operation, the two-value (one-bit) information read out in each read operation are temporarily stored in the sense latch circuit connected to the non-selected array or the buffer disposed inside the chip or the external DRAM or SRAM, for example. Three kinds of two-value (one-bit) information stored in this way are synthesized by the read conversion circuit, and are converted to, and outputted as, the two-bit information string corresponding to the four-value (two-bit) information stored in the memory cell.

As explained above, the present invention can restrict the increase of the capacity of the non-volatile semiconductor memory device such as a flash memory and can minimize the increase of the chip area resulting from a greater capacity.

We claim:

1. A semiconductor memory device having a plurality of memory cells, each memory cell having a floating gate and a control gate,
    said memory cells are set to a first state by a first write operation by taking electric charge into or out from said floating gate,
    said memory cells are set to a second state by a second write operation by taking electric charge into or out from said floating gate,
    each write operation giving a plurality of pluses including a beginning pulse and an ending pulse to said control gate of said memory cell, and a width of said beginning pulse of said first write operation is smaller than that of said ending pulse of said first writing operation.

2. The semiconductor memory device according to claim 1, wherein said semiconductor memory device is non-volatile memory.

3. A semiconductor memory device having a plurality of memory cells, each memory cell having a floating gate and a control terminal,
    said memory cells are set to a first state by a first write operation by taking electric charge into or out from said floating gate,
    said memory cells are set to a second state by a second write operation by taking electric charge into or out from said floating gate,
    each write operation giving a plurality of pulses including a beginning pulse to said control terminal of said memory cell, and a width of said beginning pulse of said first write operation is smallest in said plurality of pulses of said first writing operation.

4. The semiconductor memory device according to claim 3, wherein said semiconductor memory device is non-volatile memory.

5. A semiconductor memory device having a plurality of memory cells, each memory cell having a floating gate,
    said memory cells are set to a first state by a first write operation by taking electric charge into or out from said floating gate,
    said memory cells are set to a second state by a second write operation by taking electric charge into or out from said floating gate,
    each write operation giving a plurality of pulses to said memory cell, said plurality of pulses including a predetermined pulse and a previous pulse of said predetermined pulse, and a width of said predetermined pulse of said first write operation is greater than that of a previous pulse of said first writing operation.

6. The semiconductor memory device according to claim 5, wherein said semiconductor memory device is non-volatile memory.

7. A semiconductor memory device according to one of claims 1 to 5, wherein said memory cells are set to a third state by a third write operation by taking electric charge into or out from said floating gate.

8. The semiconductor memory device according to claim 7, wherein said semiconductor memory device is non-volatile memory.

9. A semiconductor memory device according to one of claims 1 to 5, wherein said semiconductor memory is operated to have a first period that only said first write operation is operated, and a second period that only said second write operation is operated.

10. The semiconductor memory device according to claim 9, wherein said semiconductor memory device is non-volatile memory.

11. A semiconductor memory device according to one of claims 1 to 5, wherein the width of a beginning pulse of said first write operation is different than a width of a beginning pulse of said second write operation.

12. The semiconductor memory device according to claim 11, wherein said semiconductor memory device is non-volatile memory.

13. A semiconductor memory device according to one of claims 1 to 5, wherein the height of said plurality of pulses of said first write operation is the same, and the height of said plurality of pulses of said second write operation is the same.

14. The semiconductor memory device according to claim 13, wherein said semiconductor memory device is non-volatile memory.

15. A non-volatile semiconductor memory device for making it possible to store four-value information in each of electrically erasable and writable non-volatile memory cells by controlling said memory cell to an erase state, a first write state, a second write state or a third write state, each having a different threshold voltage, comprising:

a write control circuit for setting a non-volatile memory cell to the erase state, and controlling each of a first write operation for selectively setting said non-volatile memory cell under the erase state to the first write state, a second write operation for selectively setting said non-volatile memory cell to the second write state after said first write operation, and a third write operation for selectively setting said non-volatile memory cell to the third write state after said second write operation, in a data rewrite operation of said non-volatile memory cell;

a write data conversion circuit for generating one-bit write information deciding whether or not said non-volatile memory cell is brought into the first write state by said first write operation, one-bit write information deciding whether or not said non-volatile memory cell is brought into said second write state by said second write operation, and one-bit information deciding whether or not said non-volatile memory cell is brought into the third write state by said third write operation, from two-bit write data given from outside; and a data latch circuit for latching the corresponding write information generated by said write data conversion circuit for each of said first to third write operations by said write control circuit, and selecting whether or not said memory cell is brought into the corresponding write state for each of said first to third write operations, wherein said write control circuit applies a plurality of times a write pulse voltage to said memory cell in each of said first to third write operations, and a beginning write pulse voltage is controlled so that a width of said beginning write pulse voltage is not larger than a width of each of the other write pulse voltages in a write operation and said write operation includes a plurality of pulse voltages having different pulse widths.

16. The non-volatile semiconductor memory device according to claim 15, further comprising:

a read control circuit for controlling a first read operation for selecting said non-volatile, memory cell in accordance with a word line select level between a threshold voltage of said non-volatile memory cell under the erase state and the threshold voltage under said first write state, a second read operation for selecting said non-volatile memory cell in accordance with a word line select level between the threshold voltage of said non-volatile memory cell under the first write state and the threshold voltage under the second write state, and a third read operation for selecting said non-volatile memory cell in accordance with a word line select level between the threshold voltage of said non-volatile memory cell under the second write state and the threshold voltage under the third write state, in a data read operation from said non-volatile memory cell; and a read data conversion circuit for generating two-bit read data representing to which of the erase state, the first write state, the second write state, and the third write state the state of said memory cell as the read objects corresponds, from each one-bit information obtained by each of said first to third read operations by said read control circuit.

17. The non-volatile semiconductor memory device according to claim 16, wherein, when the threshold voltages of said non-volatile memory cell in the erase state, the first write state, the second write state and the third write state are Vth0, Vth1, Vth2 and Vth3 in order from a higher voltage side, write verify voltages Vv1, Vv2 and Vv3 in the first to third write operations are so set as to satisfy the relation Vth1<Vv1<Vth0, Vth2<Vv2<Vth1 and Vth3<Vv3<Vth2, and the word line select levels Vr1, Vr2 and Vr3 in the first to third read operations are so set as to satisfy the relation Vth1<Vr1<Vth0, Vth2<Vr2<Vth1 and Vth3<Vr3<Vth2.

18. A non-volatile semiconductor memory device according to claim 16, wherein said memory cell is connected to a bit line and has a sense latch having a memory node thereof connected to said bit line and a switch device selectively connecting said bit line to an input/output line, and said data latch means is a sense latch connected to said bit line selected by said switch device.

19. The non-volatile semiconductor memory device according to claim 16, wherein said write data conversion circuit sets each write information in each of said first to third write operations to a write non-select level in accordance with the first state of said two-bit write data, sets the write information in said first write operation to a write select level and the write information in each of said the second and third write operations to the write non-select level in accordance with the second state of said two-bit data, sets the write information in each of said first and second write operations to the write select level and the write information in said write operations to the write nonselect level in accordance with the third state of said two-bit write data, and sets the write information in each of said first to third write operations to the select level in accordance with the fourth state of said two-bit write data.

20. The non-volatile semiconductor memory device according to claim 19, wherein said read data conversion circuit sets said two-bit read data to the first state when three-bit information obtained by said first to third read operations all have a first logic value, sets said two-bit read data to a second state when one-bit information obtained by said first read operation has a second logic value and the two-bit information obtained by said second and third read operations all have the first logic value, sets the two-bit read data to a third state when two-bit information obtained by said first and second read operations have the second logic value and the two-bit information obtained by said third read operation has the first logic value, and sets the two bit read data to a fourth state when the two-bit information obtained by said first to third read operations all have the second logic value.

21. The non-volatile semiconductor memory device according to claim 19, further comprising:
   a power source switch circuit for switching the write verify voltage in accordance with each of said first to third write operations.

22. The non-volatile semiconductor memory device according to claim 15, wherein, when the threshold voltages of said non-volatile memory cell in the erase state, the first write state, the second write state, and the third write state are Vth0, Vth1, Vth2 and Vth3 from the higher side or the lower side, these threshold voltages are set so that the Hamming distance of bit information represented by the erase state or any of the write states corresponding to the adjacent threshold voltages becomes minimal.

23. The non-volatile semiconductor memory device according to claim 15, wherein, when the threshold voltages of said non-volatile memory cell in the erase state, the first write state, the second write state, and the third write state are Vth0, Vth1, Vth2 and Vth3 from the higher side or the lower side, these threshold voltages are set so that the Hamming distance of the bit information represented by the erase state or any of the write states corresponding to the adjacent threshold voltages becomes 1.

24. The non-volatile semiconductor memory device according to claim 15, wherein, when the threshold voltages of said non-volatile memory cell in the erase state, the first write state, the second write state, and the third write state are Vth0, Vth1, vth2 and Vth3 from the higher side or the lower side, these threshold voltages are set so that the threshold voltages of said memory cell at the time of irradiation of ultra-violet rays become most approximate to Vth0 or Vth3.

25. The non-volatile semiconductor memory device according to claim 13, wherein, when the threshold voltages of said non-volatile memory cell in the erase state, the first write state, the second write state, and the third write state are Vth0, Vth1, Vth2 and Vth3 from the higher side or the lower side, these threshold voltages are set so that the Hamming distance of the bit information represented by the erase state or any of the write states corresponding to the adjacent threshold voltages becomes minimal, and the threshold voltage of the memory cell under a thermal equilibrium state is most approximate to Vth0 or Vth3.

26. A non-volatile semiconductor memory device for making it possible to store four-value information in each of electrically erasable and writable non-volatile memory cells by controlling said memory cell to an erase state, a first write state, a second write state or a third write state, each having a different threshold voltage, comprising:
   a write control circuit for setting a non-volatile memory cell to the erase state, and controlling each of a first write operation for selectively setting said non-volatile memory cell under the erase state to the first write state, a second write operation for selectively setting said non-volatile memory cell to the second write state after said first write operation, and a third write operation for selectively setting said non-volatile memory cell to the third write state after said second write operation, in a data rewrite operation of said non-volatile memory cell;
   a write data conversion circuit for generating one-bit write information deciding whether or not said non-volatile memory cell is brought into the first write state by said first write operation, one-bit write information deciding whether or not said non-volatile memory cell is brought into said second write state by said second write operation, and one-bit information deciding whether or not said non-volatile memory cell is brought into the third write state by said third write operation, from two-bit write data given from outside; and
   a data latch circuit for latching the corresponding write information generated by said write data conversion circuit for each of said first to third write operations by said write control circuit, and selecting whether or not said memory cell is brought into the corresponding write state for each of said first to third write operations,
   wherein said write control circuit applies a plurality of times a write pulse voltage to said memory cell in each of said first to third write operations, and a beginning write pulse voltage is controlled so that a height of said beginning write pulse, voltage is not larger than a height of each of the other write pulse voltages in a write operation and said write operation includes a plurality of pulse voltages having different pulse heights.

27. The non-volatile semiconductor memory device according to claim 26, further comprising:
   a read control circuit for controlling a first read operation for selecting said non-volatile memory cell in accordance with a word line select level between a threshold voltage of said non-volatile memory cell under the erase state and the threshold voltage under said first write state, a second read operation for selecting said non-volatile memory cell in accordance with a word line select level between the threshold voltage of said non-volatile memory cell under the first write state and the threshold voltage under the second write state, and a third read operation for selecting said non-volatile memory cell in accordance with a word line select level between the threshold voltage of said non-volatile memory cell under the second write state and the threshold voltage under the third write state, in a data read operation from said non-volatile memory cell; and
   a read data conversion circuit for generating two-bit read data representing to which of the erase state, the first write state, the second write state, and the third write state the state of said memory cell as the read objects corresponds, from each one-bit information obtained by each of said first to third read operations by said read control circuit.

28. The non-volatile semiconductor memory device according to claim 27, wherein, when the threshold voltages of said non-volatile memory cell in the erase state, the first write state, the second write state and the third write state are Vth0, Vth1, Vth2 and Vth3 in order from a higher voltage side, write verify voltages Vv1, Vv2 and Vv3 in the first to third write operations are so set as to satisfy the relation Vth1<Vv1<Vth0, Vth2<Vv2<Vth1 and Vth3<Vv3<Vth2, and the word line select levels Vr1, Vr2 and Vr3 in the first to third read operations are so set as to satisfy the relation Vth1<Vr1<Vth0, Vth2<Vr2<Vth1 and Vth3<Vr3<Vth2.

29. The non-volatile semiconductor memory device according to claim 27, wherein said memory cell is connected to a bit line and has a sense latch having a memory node thereof connected to said bit line and a switch device selectively connecting said bit line to an input/output line, and said data latch means is a sense latch connected to said bit line selected by said switch device.

30. The non-volatile semiconductor memory device according to claim 27, wherein said write data conversion circuit sets each write information in each of said first to third write operations to a write non-select level in accordance with the first state of said two-bit write data, sets the write information in said first write operation to a write select level and the write information in each of said the second and third write operations to the write non-select level in accordance with the second state of said two-bit data, sets the write information in each of said first and second write operations to the write select level and the write information in said write operations to the write nonselect level in accordance with the third state of said two-bit write data, and sets the write information in each of said first to third write operations to the select level in accordance with the fourth state of said two-bit write data.

31. The non-volatile semiconductor memory device according to claim 30, wherein said read data conversion circuit sets said two-bit read data to the first state when three-bit information obtained by said first to third read operations all have a first logic value, sets said two-bit read data to a second state when one-bit information obtained by said first read operation has a second logic value and the two-bit information obtained by said second and third read operations all have the first logic value, sets the two-bit read data to a third state when two-bit information obtained by said first and second read operations have the second logic value and the two-bit information obtained by said third read operation has the first logic value, and sets the two bit read data to a fourth state when the two-bit information obtained by said first to third read operations all have the second logic value.

32. The non-volatile semiconductor memory device according to claim 20, further comprising:
a power source switch circuit for switching the write verify voltage in accordance with each of said first to third write operations.

33. The non-volatile semiconductor memory device according to claim 26, wherein, when the threshold voltages of said non-volatile memory cell in the erase state, the first write state, the second write state, and the third write state are Vth0, Vth1, Vth2 and Vth3 from the higher side or the lower side, these threshold voltages are set so that the Hamming distance of bit information represented by the erase state or any of the write states corresponding to the adjacent threshold voltages becomes minimal.

34. A non-volatile semiconductor memory device according to claim 26, wherein, when the threshold voltages of said non-volatile memory cell in the erase state, the first write state, the second write state, and the third write state are Vth0, Vth1, Vth2 and Vth3 from the higher side or the lower side, these threshold voltages are set so that the Hamming distance of the bit information represented by the erase state or any of the write states corresponding to the adjacent threshold voltages becomes 1.

35. The non-volatile semiconductor memory device according to claim 26, wherein, when the threshold voltages of said non-volatile memory cell in the erase state, the first write state, the second write state, and the third write state are Vth0, Vth1, Vth2 and Vth3 from the higher side or the lower side, these threshold voltages are set so that the threshold voltages of said memory cell at the time of irradiation of ultra-violet rays become most approximate to Vth0 or Vth3.

36. The non-volatile semiconductor memory device according to claim 26, wherein, when the threshold voltages of said non-volatile memory cell in the erase state, the first write state, the second write state, and the third write state are Vth0, Vth1, Vth2 and Vth3 from the higher side or the lower side, these threshold voltages are set so that the Hamming distance of the bit information represented by the erase state or any of the write states corresponding to the adjacent threshold voltages becomes minimal, and the threshold voltage of the memory cell under a thermal equilibrium state is most approximate to Vth0 or Vth3.

37. A semiconductor memory device for storing a plurality of bit informations per memory cell by taking the charge into and out from the floating gate of a plurality of memory cells each having said floating gate and a control gate, comprising:
a voltage generation circuit for generating a plurality of voltages;
a write circuit for applying a write pulse giving a voltage necessary for taking in and out the charge to said memory cell; and
a judgement circuit for serially applying a plurality of voltages to said control gate and judging whether or not said memory cell has a required threshold voltage on the basis of a current value flowing through said memory cell,
wherein said write circuit is constituted so that a write operation for giving said write pulse to each of said memory cells and a verify operation for judging whether or not said memory cell has a required threshold voltage, to be executed after said write operation, together constitute one cycle, and when said cycles are repeated a plurality of times and the number of times increases, a pulse width of a beginning write pulse is not larger than a pulse width of each of the other write pulses of said write operation and said write operation includes a plurality of pulse voltages having different pulse widths.

38. A semiconductor memory device according to claim 37, wherein said semiconductor memory device is non-volatile memory.

39. A semiconductor memory device for storing a plurality of bit information per memory cell, including a plurality of memory cells each having a floating gate and a control gate, for taking charge into and out from said floating gate, comprising:
a voltage generation circuit for generating a plurality of voltages;
a write circuit for applying a write pulse giving a necessary voltage for taking the charge into and out from said floating gate, to said memory cell; and
a judgement circuit for serially applying a plurality of voltages to said control gate, and judging whether or not said memory cell has a required threshold voltage on the basis of a current value flowing through said memory cell,
wherein said write circuit is constituted so that a write operation for giving said write pulse to each of said memory cells and a verify operation for judging whether or not said memory cell has a required threshold voltage, to be executed after said write operation, constitute one cycle, and when said cycle is repeated a plurality of times and the number of times increases, a height of a beginning write pulse is not larger than a height of the other write pulses of said write operation and said write operation includes a plurality of pulse voltages having different pulse heights.

40. The semiconductor memory device according to claim 39, wherein said semiconductor memory device is non-volatile memory.

* * * * *